United States Patent
Yamazaki et al.

(10) Patent No.: US 6,573,195 B1
(45) Date of Patent: Jun. 3, 2003

(54) METHOD FOR MANUFACTURING A SEMICONDUCTOR DEVICE BY PERFORMING A HEAT-TREATMENT IN A HYDROGEN ATMOSPHERE

(75) Inventors: Shunpei Yamazaki, Tokyo (JP); Taketomi Asami, Kanagawa (JP); Hidehito Kitakado, Hyogo (JP); Yasuyuki Arai, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/490,974

(22) Filed: Jan. 24, 2000

(30) Foreign Application Priority Data

Jan. 26, 1999  (JP) ............................. 11-017753

(51) Int. Cl.⁷ ......................................... H01L 21/469
(52) U.S. Cl. ..................................... 438/783; 438/786
(58) Field of Search ................. 438/622, 769, 438/783, 786, FOR 201, FOR 355, FOR 434, 151–166, 197, 48, 22

(56) References Cited

U.S. PATENT DOCUMENTS

| | | | |
|---|---|---|---|
| 5,365,081 A | 11/1994 | Yamazaki et al. | 257/67 |
| 5,559,042 A | 9/1996 | Yamazaki et al. | 437/21 |
| 5,565,378 A | * 10/1996 | Harada et al. | 228/180.5 |
| 5,620,906 A | 4/1997 | Yamaguchi et al. | 438/162 |
| 5,736,439 A | 4/1998 | Yamazaki et al. | 438/166 |
| 5,897,346 A | 4/1999 | Yamaguchi et al. | 438/162 |

FOREIGN PATENT DOCUMENTS

| | | |
|---|---|---|
| JP | 6-075247 | 3/1994 |
| JP | 6-118446 | 4/1994 |
| JP | 9-064370 | 3/1997 |

OTHER PUBLICATIONS

English translation of Japanese Patent Application No. 6–075247, published Mar. 18, 1994.
English translation of Japanese Patent Application No. 6–118446, published Apr. 28, 1994.
English translation of Japanese Patent Application No. 9–064370, published Mar. 7, 1997.

* cited by examiner

Primary Examiner—Georgia Fourson
Assistant Examiner—Thanh V Pham
(74) Attorney, Agent, or Firm—Cook, Alex, McFarron, Manzo, Cummings & Mehler, Ltd.

(57) ABSTRACT

In fabricating a semiconductor device, a hydrogen-containing first insulating film is formed over a semiconductor layer, a gate insulating film and a gate electrode, and a first heat-treatment in a hydrogen atmosphere is performed. A second insulating film can be formed on the first insulating film, and a second heat-treatment in a hydrogen atmosphere performed. A hydrogen-containing third insulating film can be formed on the second insulating film, and a third heat-treatment in an atmosphere containing hydrogen or nitrogen performed. By these methods, damages to a semiconductor layer caused by hydrogenation can be avoided.

69 Claims, 21 Drawing Sheets

FIG. IA
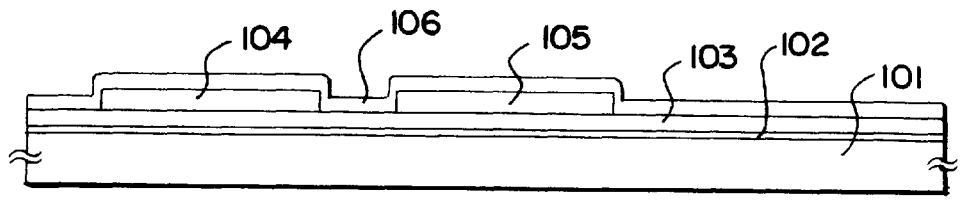
FIG. IB
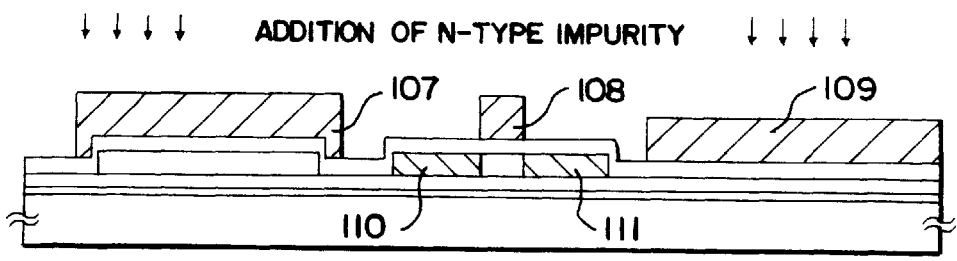
FIG. IC
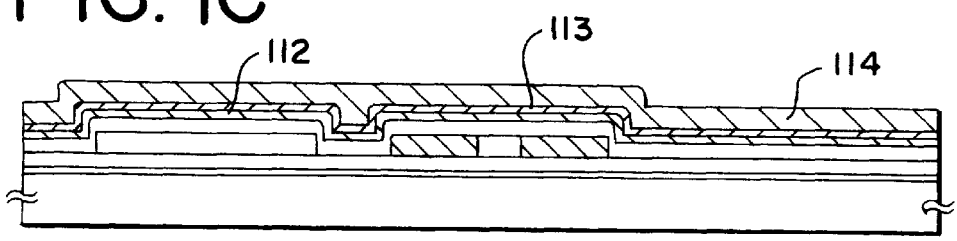
FIG. ID
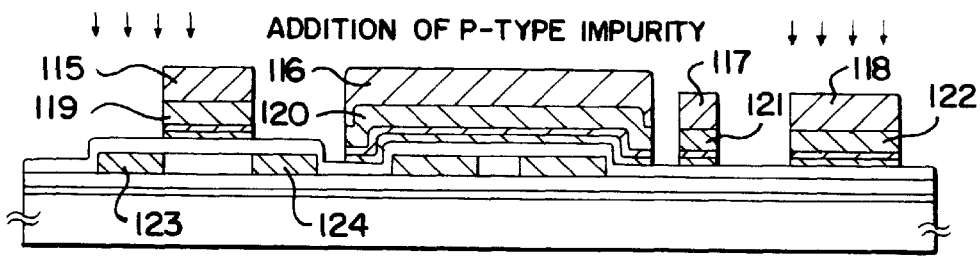
FIG. IE
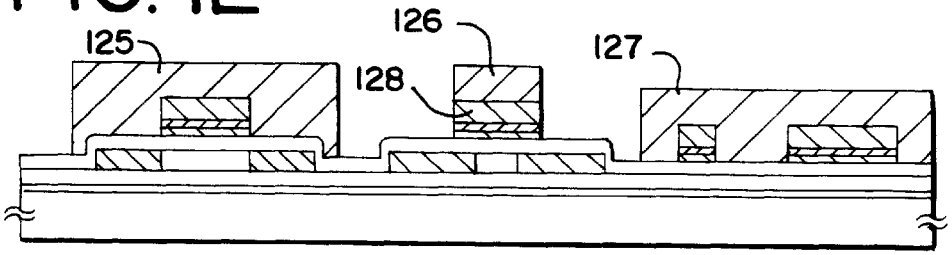

ADDITION OF N-TYPE IMPURITY

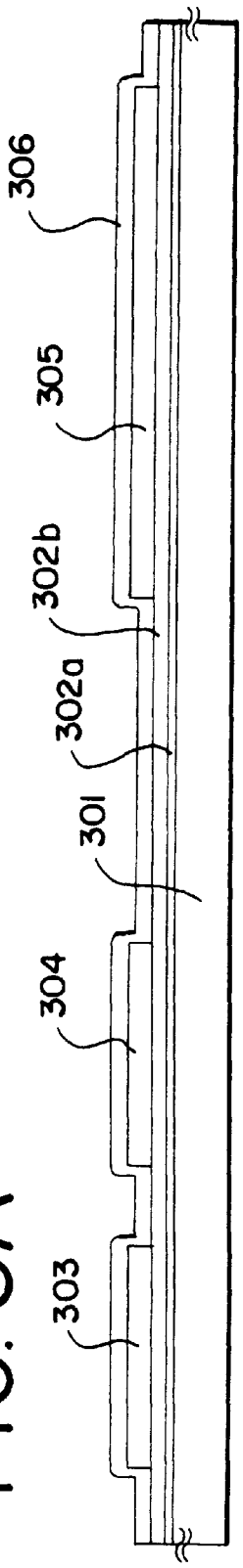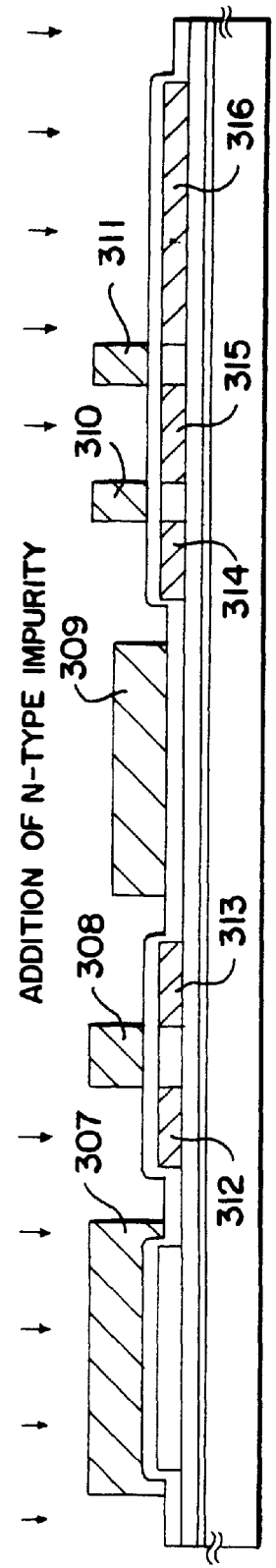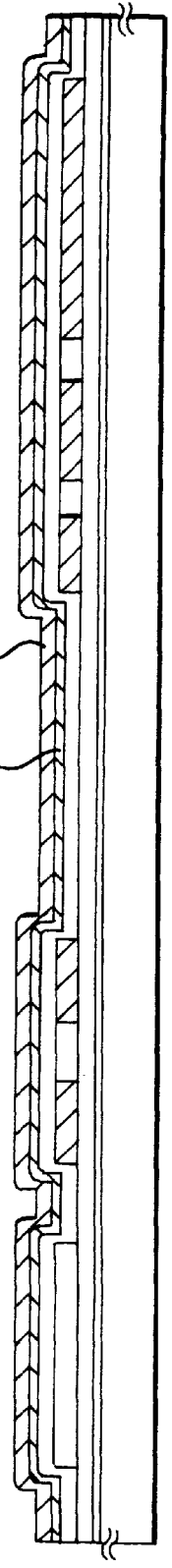

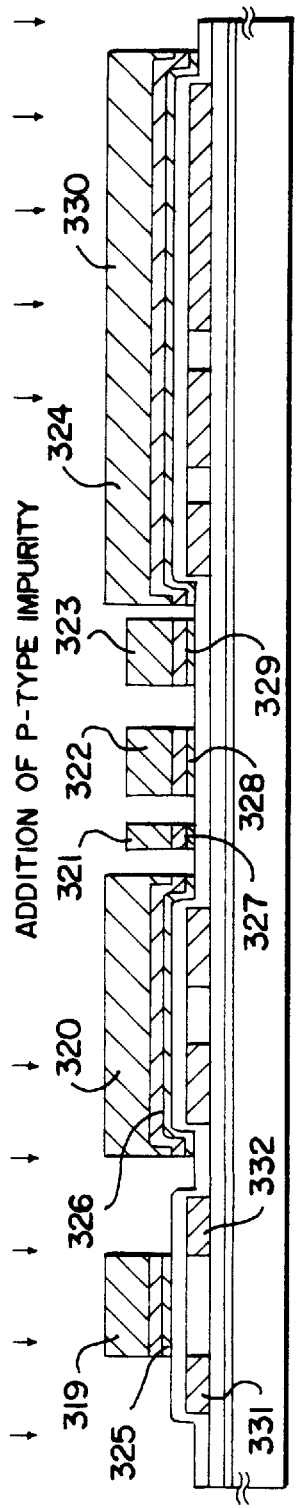
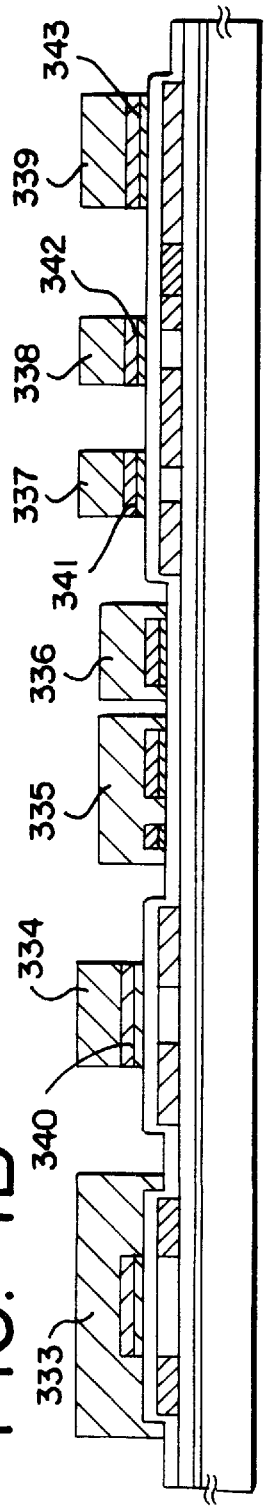
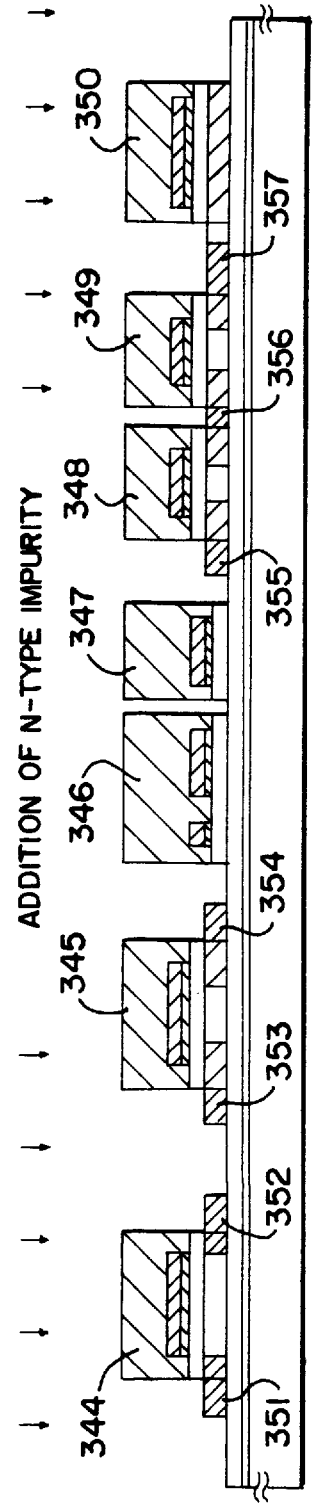

B — PIXEL MATRIX CIRCUIT (N-CHANNEL TFT) — HOLDING CAPACITANCE — B'

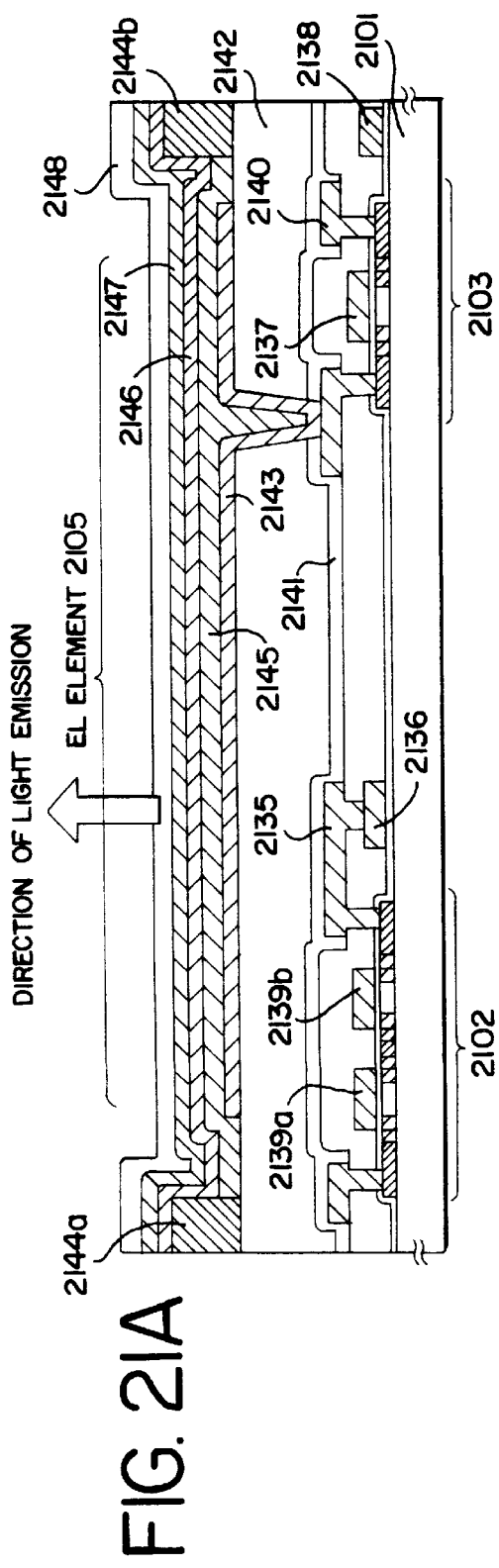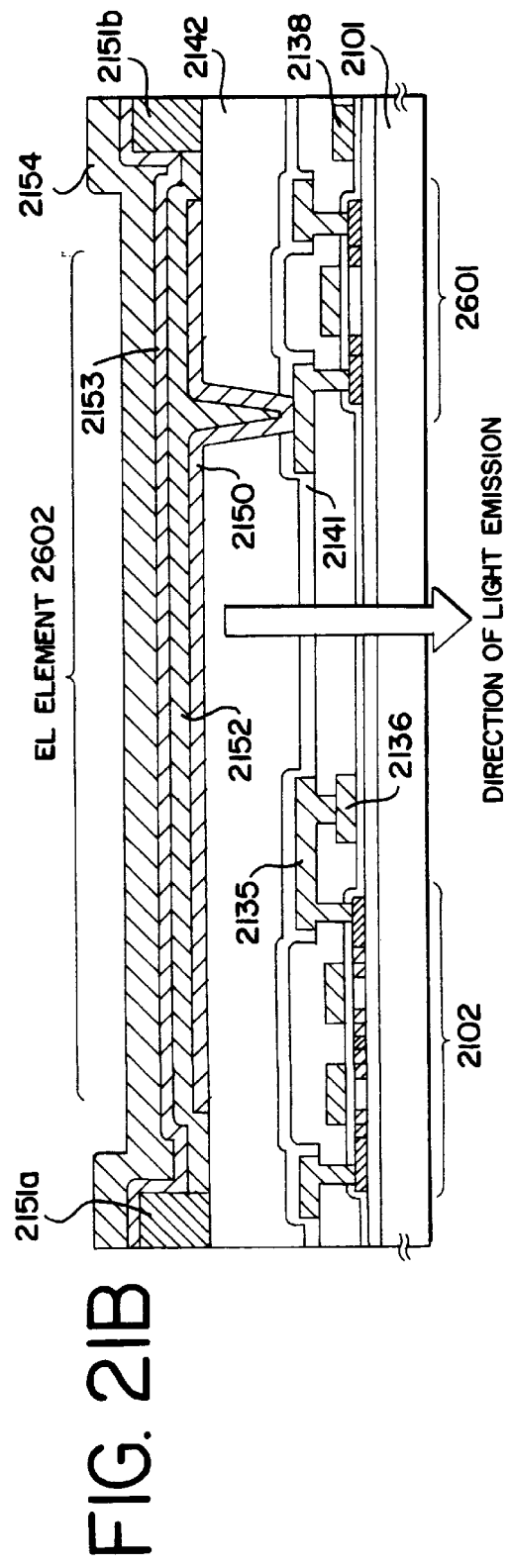
FIG. 21A
FIG. 21B

METHOD FOR MANUFACTURING A SEMICONDUCTOR DEVICE BY PERFORMING A HEAT-TREATMENT IN A HYDROGEN ATMOSPHERE

BACKGROUND OF THE INVENTION

1. Field of the Invention

This invention relates to a semiconductor device having an active circuit constituted by thin film transistors formed over a substrate, and a method of fabricating the semiconductor device. More particularly, this invention can be used appropriately for fabricating thin film transistors using a crystalline semiconductor layer. The present invention can be utilized also for fabricating an integrated circuit that comprises thin film transistors, an electro-optical device typified by an active matrix display device, and an image sensor, and an electronic appliance having the electro-optical device mounted thereto.

2. Description of the Related Art

A semiconductor device typified by an active matrix liquid crystal display device comprising a large number of thin film transistors (TFTs) arranged on a substrate has been developed. In order to accomplish high mobility in the TFTs, it has been believed preferable to use a crystalline semiconductor film for a semiconductor layer. Most of polycrystalline semiconductors that are utilized for the TFT are formed by crystallization technologies such as laser annealing and thermal annealing. However, because a large number of defects exist in the crystalline semiconductor film so crystallized, mobility of the carriers and the life time are markedly lowered with the result that electric characteristics of the TFT are adversely affected.

To eliminate the defects inside the crystalline semiconductor film and an inter-layer insulating film, a hydrogenation process has been known as one of the effective means. The hydrogenation process includes a plasma hydrogenation process that neutralizes the defects by generating hydrogen plasma, and a hydrogenation method that executes heat-treatment in a hydrogen atmosphere. These hydrogen process steps are appropriately incorporated in the fabrication process steps of the TFT.

According to the hydrogenation process utilizing the plasma, however, the crystalline semiconductor film is directly exposed to the plasma in order to effectively introduce hydrogen. In consequence, there remains the problem that the crystalline semiconductor film is damaged by the ions that are formed simultaneously in the plasma. To recover this damage, heat-treatment at 400 to 600° C. is believed necessary, but when heating is made to 400° C. or above, hydrogen is re-emitted from the crystalline semiconductor film. If any atmospheric components such as nitrogen and oxygen remain in the atmosphere in the plasma hydrogenation method, these elements, too, are converted to the plasma and contaminate the crystalline semiconductor film.

When the plasma hydrogenation method is carried out from the surface side of an inter-layer insulating film formed on a gate electrode, the defects existing inside the crystalline semiconductor film can be neutralized to a certain extent. However, the hydrogen concentration introduced into the film by this method has a distribution such that it progressively decreases from the surface to its inside. For this reason, it has been difficult to sufficiently hydrogenate the crystalline semiconductor film on the lower layer side. The heat-treatment process in the hydrogen atmosphere as another method involves the problem that the process time gets unavoidably extended in order to improve the hydrogenation effect.

SUMMARY OF THE INVENTION

The present invention is directed to provide a high performance semiconductor device that can solve the problems described above, and can be efficiently processed by a hydrogenation process without imparting damage and contamination of a crystalline semiconductor film, and a method of fabricating such a semiconductor device.

A method of fabricating a semiconductor device according to the present invention comprises the steps of forming a hydrogen-containing first insulating film over a semiconductor layer that is formed into a predetermined shape over a substrate, and then conducting heat-treatment in a hydrogen atmosphere or in an atmosphere containing hydrogen that is formed by generating hydrogen plasma. The first insulating film may be an inter-layer insulating film formed over a gate electrode. When hydrogenation is carried out through this first insulating film, the problems of damage to a semiconductor layer and its contamination can be avoided. Because hydrogen is supplied to the hydrogen-containing first insulating film, hydrogen in this first insulating film diffuses into its lower layer and hydrogenation of the semiconductor layer proceeds.

Another method of fabricating a semiconductor device according to the present invention comprises the steps of forming a hydrogen-containing first insulating film over a semiconductor layer that is formed into a predetermined shape over a substrate, forming a second insulating film in close contact with the first insulating film, and then executing heat-treatment in a hydrogen atmosphere or in an atmosphere containing hydrogen that is formed by plasma generation. Hydrogen that is supplied from the surface of the second insulating film diffuses into the first insulating film, and hydrogen in the first insulating film diffuses into the lower layer, so that the semiconductor layer can be hydrogenated. In this case, the heat-treatment may be carried out in the hydrogen atmosphere or in the atmosphere containing hydrogen formed by plasma generation, after the first insulating film is formed.

Another method of fabricating a semiconductor device according to the present invention comprises the steps of forming a hydrogen-containing first insulating film over a semiconductor layer that is formed into a predetermined shape over a substrate, conducting then heat-treatment in a hydrogen atmosphere or in an atmosphere containing hydrogen formed by plasma generation, forming a hydrogen-containing third insulating film on the first insulating film, and conducting heat-treatment in an atmosphere containing hydrogen or nitrogen. When the third insulating film comprises a compact film of a silicon nitride oxide or a silicon nitride film, the quantity of hydrogen dissociating from the first insulating film into the gaseous phase can be reduced and hydrogenation of the semiconductor layer can be attained more reliably.

More preferably, the method of fabricating a semiconductor device comprises the steps of forming a hydrogen-containing first insulating film over a semiconductor layer formed into a predetermined shape over a substrate, conducting then heat-treatment in a hydrogen atmosphere or in an atmosphere containing hydrogen that is formed by plasma generation, forming a second insulating film in contact with the first insulating film, conducting heat-treatment in a hydrogen atmosphere or in an atmosphere containing hydrogen formed by plasma generation, and conducting heat-treatment in an atmosphere containing hydrogen or nitrogen after the hydrogen-containing third insulating film is formed on the second insulating film. According to this construction, hydrogen that is supplied by the step of conducting the heat-treatment in the hydrogen atmosphere or in the atmosphere containing hydrogen formed by plasma generation diffuses into the lower layer, and hydrogenation of the semiconductor layer can be effected reliably.

The first insulating film is preferably a silicon nitride oxide film made from silane, nitrous oxide or ammonia. The second insulating film may be a silicon nitride oxide film made from silane or nitrous oxide. The third insulating film is preferably a silicon nitride oxide film made from silane, nitrous oxide or ammonia, or a silicon nitride film made from silane, ammonia or nitrogen. All the first to third insulating films fabricated in this way have the carbon concentration in the films of not greater than $2 \times 10^{19} cm^{-3}$.

Therefore, the semiconductor device according to the present invention comprises, over a semiconductor layer formed into a predetermined shape, a first insulating film comprising a silicon nitride oxide film having a hydrogen concentration of at least 1 atomic % to less than 30 atomic % and a nitrogen concentration of at least 10 atomic % to less than 25 atomic %, and a third insulating film keeping contact with the first insulating film and comprising a silicon nitride oxide film having a hydrogen concentration of at least 1 atomic % to less than 30 atomic % and a nitrogen concentration of at least 10 atomic % to less than 25 atomic % or a silicon nitride film having a hydrogen concentration of at least 1 atomic % to less than 30 atomic %.

The semiconductor device may comprise, over a semiconductor layer formed into a predetermined shape, a first insulating film comprising a silicon nitride oxide film containing at least 10 atomic % to less than 30 atomic % of hydrogen, and having a nitrogen concentration of at least 10 atomic % to less than 25 atomic %, a second insulating film comprising a silicon nitride oxide film, keeping contact with the first insulating film and having a nitrogen concentration of less than 10 atomic %, and a third insulating film keeping contact with the second insulating film and comprising a silicon nitride oxide film having a nitrogen concentration of at least 1 atomic % to less than 25 atomic % or a silicon nitride film having a hydrogen concentration of at least 1 atomic % to less than 30 atomic %.

In a semiconductor device including a gate insulating film formed in contact with a semiconductor layer shaped into a predetermined shape and a gate electrode formed at a predetermined position on the gate insulating film, a semiconductor device according to the present invention comprises a first insulating film keeping contact with the gate insulating film and with the gate electrode and comprising a silicon nitrogen oxide film containing at least 1 atomic % to less than 30 atomic % of hydrogen and having a nitrogen concentration of at least 10 atomic % to less than 25 atomic %, and a third insulating film keeping contact with the first insulating film and comprising a silicon nitride oxide film having a nitrogen concentration of at least 1 atomic % to less than 30 atomic % and a nitrogen concentration of at least 10 atomic % to less than 25 atomic %, or a silicon nitride film having a hydrogen concentration of at least 1 atomic % to less than 30 atomic %.

In a semiconductor device including a gate insulating film so formed as to keep contact with a semiconductor layer formed into a predetermined shape and a gate electrode formed at a predetermined position on the gate insulating film, a semiconductor device according to the present invention comprises a first insulating film comprising a silicon nitride oxide film so formed as to keep contact with the gate insulating film and with the gate electrode, containing at least 1 atomic % to less than 30 atomic % of hydrogen and having a nitrogen concentration of at least 10 atomic % to less than 25 atomic %, a second insulating film keeping contact with the first insulating film and comprising a silicon nitride oxide film having a nitrogen concentration of less than 10 atomic %, and a third insulating film keeping contact with the second insulating film and comprising a silicon nitride oxide film having a hydrogen concentration of at least 1 atomic % to less than 30 atomic % and a nitrogen concentration of at least 10 atomic % to less than 25 atomic %, or a silicon nitride film having a nitrogen concentration of at least 1 atomic % to less than 30 atomic %.

BRIEF DESCRIPTION OF THE DRAWINGS

These and other objects and novel features of the present invention will become more apparent from the following detailed description when taken in conjunction with the accompanying drawings, wherein:

FIG. 1 is a sectional view showing a fabrication process of a TFT;

FIG. 3 is a sectional view showing a fabrication process of an active matrix substrate;

FIG. 4 is a sectional view showing a fabrication process of an active matrix substrate;

FIG. 21 is a sectional view of a pixel portion of the EL display device;

DESCRIPTION OF THE PREFERRED EMBODIMENTS

Figure 9A:
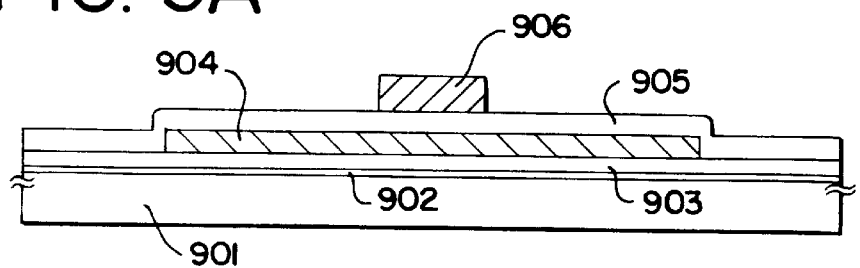
FIG. 9 is an explanatory view of an embodiment of the present invention.
Figure 9B:
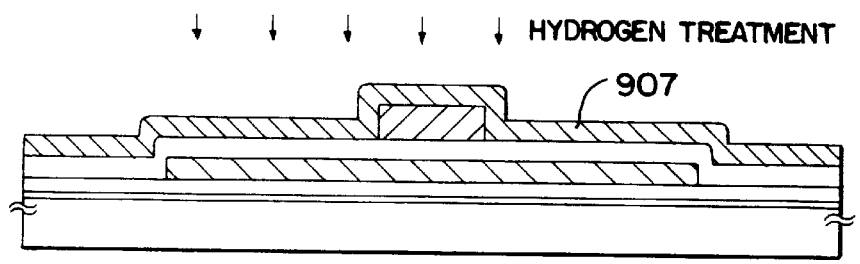
Figure 9C:
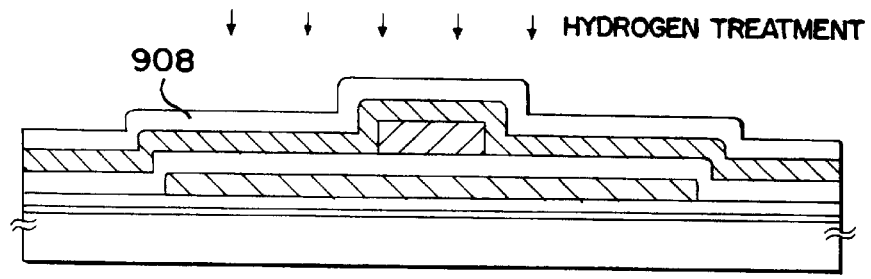
Figure 9D:
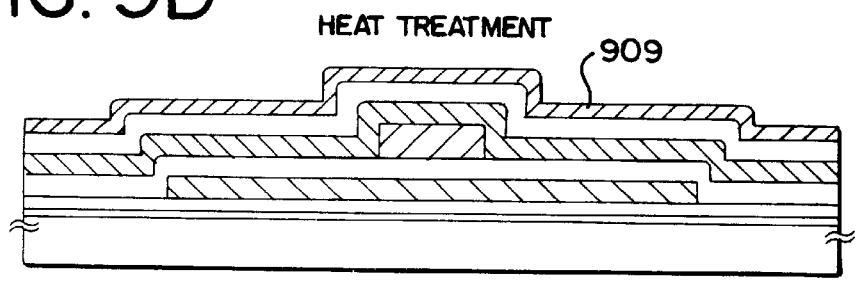

An embodiment of the present invention will be explained with reference to FIG. 9. In FIG. 9(A), underlying films 902 and 903 of a semiconductor layer are constituted by a silicon nitride oxide film on a substrate 901. A semiconductor layer 904 formed into a predetermined shape is formed over the substrate 901. This semiconductor layer uses a crystalline semiconductor film that is formed by crystallizing an amorphous semiconductor film by laser crystallization, thermal crystallization or crystallization using a catalytic element. A gate insulating film 905 is formed in close contact with the semiconductor layer, and a gate electrode 906 is arranged at a predetermined position on the gate insulating film.

A first insulating film is formed by using silicon nitride oxide film 907 in such a fashion as to cover the gate insulating film 905 and the gate electrode 906. This silicon nitride oxide film is formed to a thickness of 0.1 to 0.5 μm by a plasma CVD process using silane ($SiH_4$), nitrous oxide ($N_2O$) and ammonia ($NH_3$) as the starting materials. The silicon nitride oxide film fabricated in this way contains 1 to 30 atomic % of hydrogen and 10 to 25 atomic % of nitrogen, though depending on the substrate temperature at the time of film formation (FIG. 9(B)).

The first hydrogenation step is then carried out preferably. This step is carried out in a hydrogen atmosphere or in an atmosphere containing hydrogen converted to hydrogen plasma. For example, the treatment is carried out in the hydrogen-containing atmosphere at 300 to 550° C., preferably at 350 to 450° C., for 1 to 12 hours. The treatment may also be carried out in an atmosphere of a non-depositing gas such as hydrogen or ammonia at a pressure of 1 to 500 Pa, a substrate temperature of 200 to 500° C., preferably 300 to 450° C., for 5 to 120 minutes.

A second insulating film 908 is formed to a thickness of 100 to 500 nm using a silicon nitride oxide film while keeping a close contact with the first insulating film 907. The silicon nitride oxide film may be fabricated from $SiH_4$ and $N_2O$ (FIG. 9(C)). The third insulating film 909 is then formed. The third insulating film is formed from a silicon nitride oxide film or a silicon nitride film using a plasma CVD process, and is preferably a compact film. A plasma hydrogenation treatment may be carried out by introducing hydrogen and ammonia as the second hydrogenation step prior to the formation of the third insulating film. Hydrogen is introduced into the second insulating film by this plasma hydrogenation step. This step can be executed as a continuous step to the formation of the third insulating film by merely selecting an appropriate gas seed. The third hydrogenation step, that is to be executed after the formation of the third insulating film, is preferably a heat-treatment step that is carried out in an atmosphere containing hydrogen or nitrogen at 300 to 550° C. for 1 to 12 hours (FIG. 9(D)).

Figure 10A:
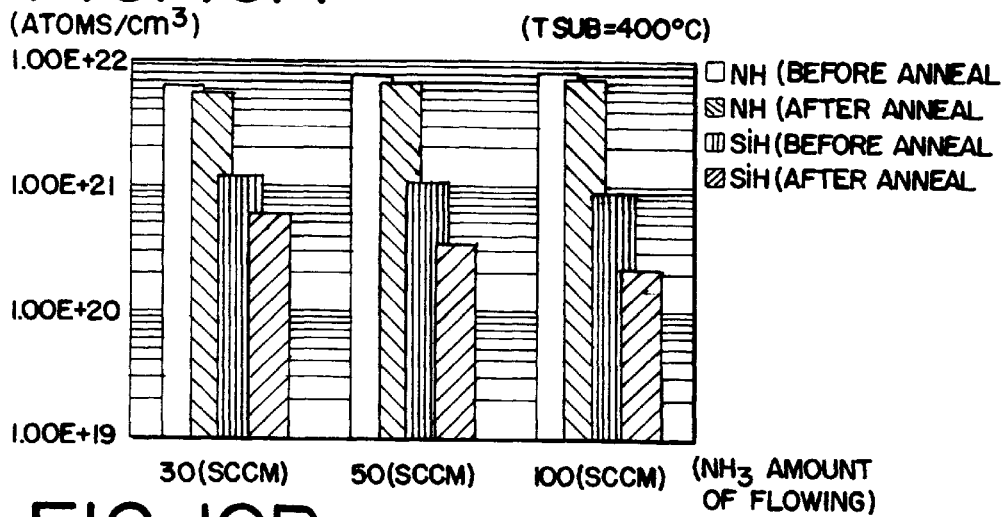
FIG. 10 is a graph showing the change of a hydrogen concentration in a silicon nitride oxide film due to heat-treatment.
Figure 10B:
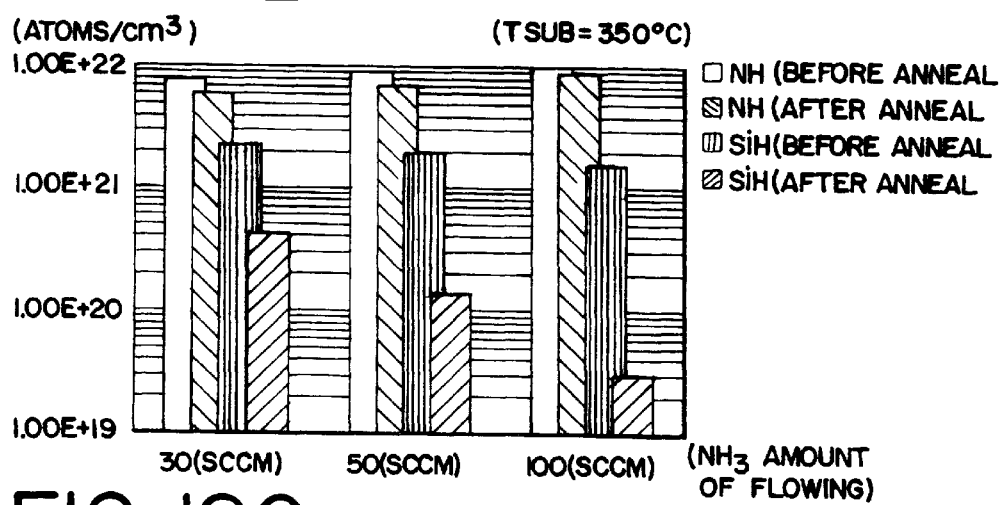
Figure 10C:
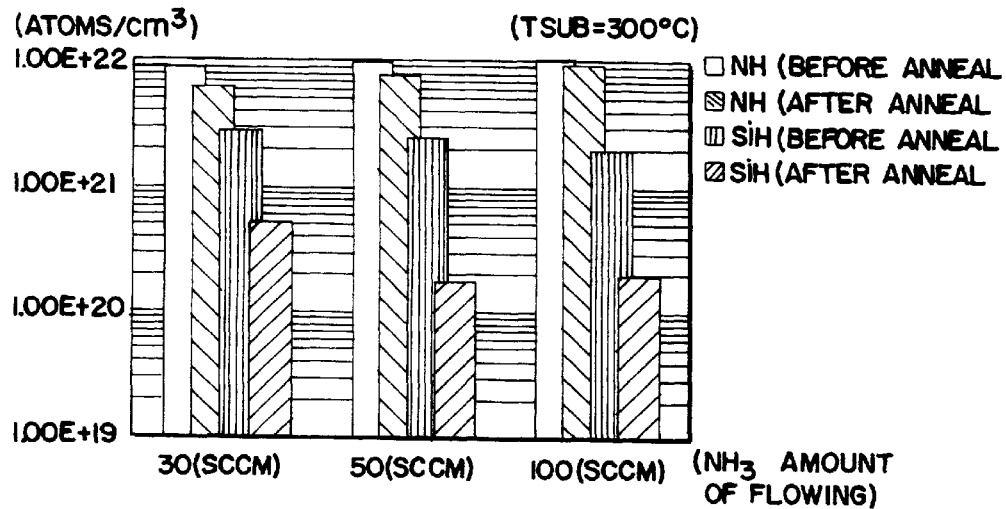
Figure 11A:
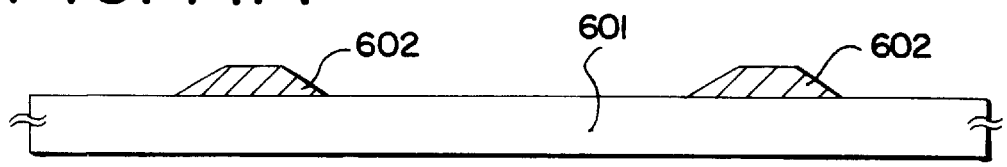
FIG. 11 is a sectional view showing a fabrication process of a TFT.
Figure 11B:
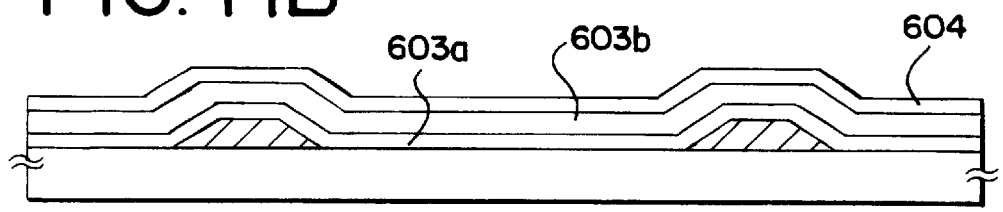
Figure 11C:
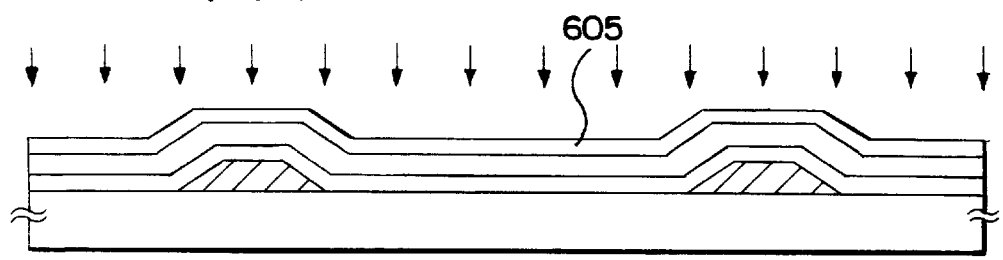
Figure 11D:
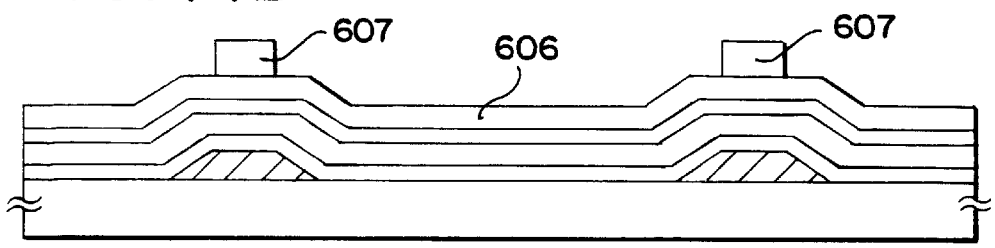
Figure 11E:
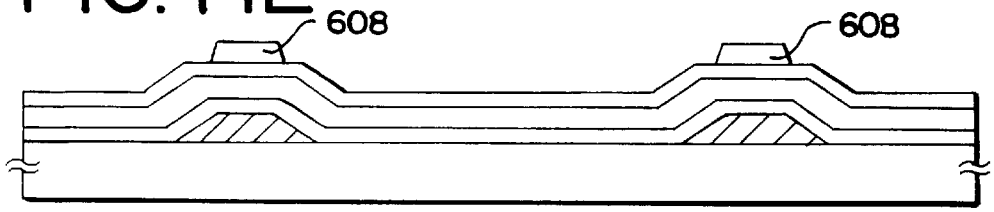
Figure 12A:
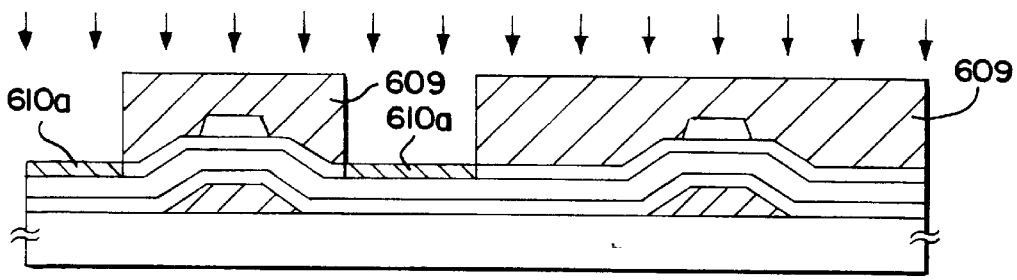
FIG. 12 is a sectional view showing a fabrication process of a TFT.
Figure 12B:
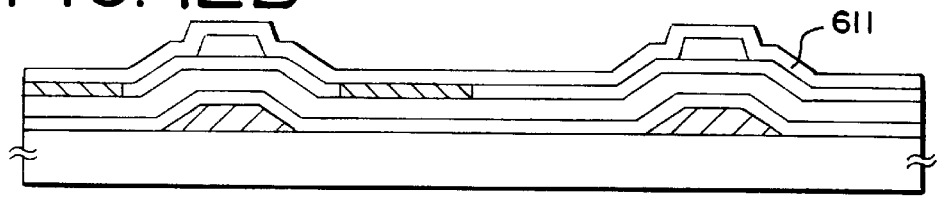
Figure 12C:
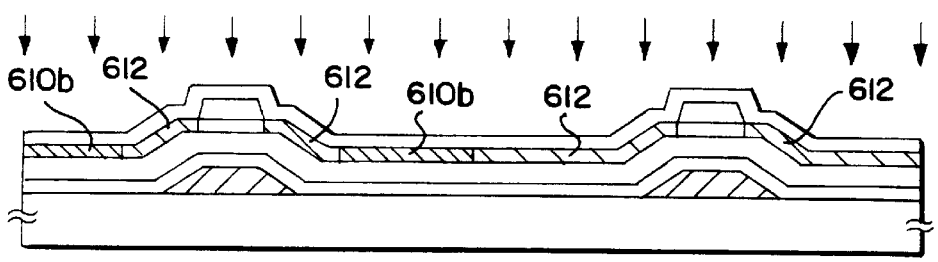
Figure 12D:
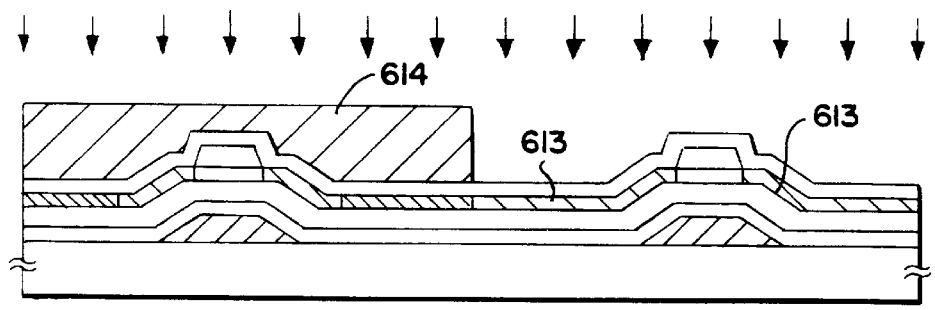
Figure 12E:
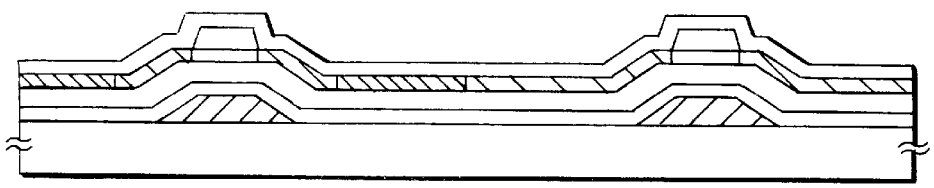
Figure 13A:
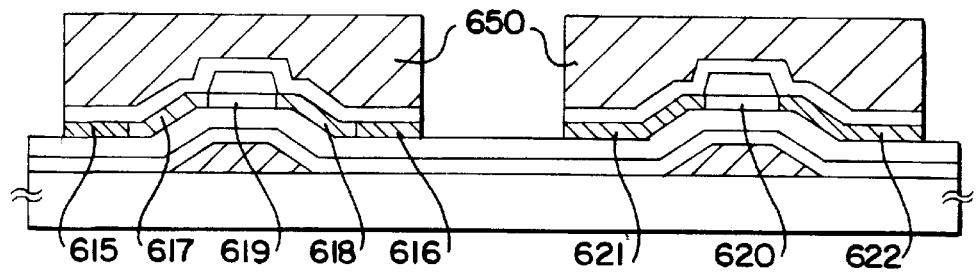
FIG. 13 is a sectional view showing a fabrication process of a TFT.
Figure 13B:
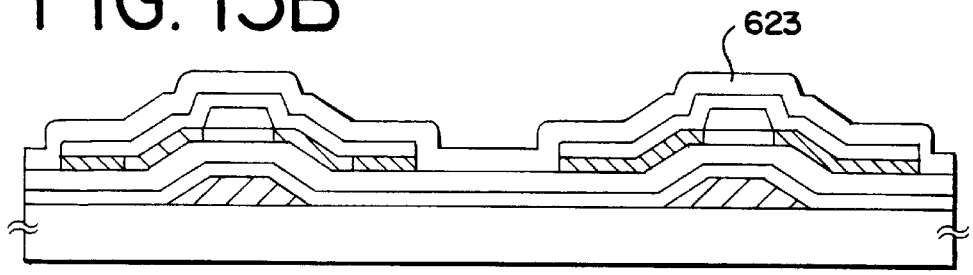
Figure 13C:
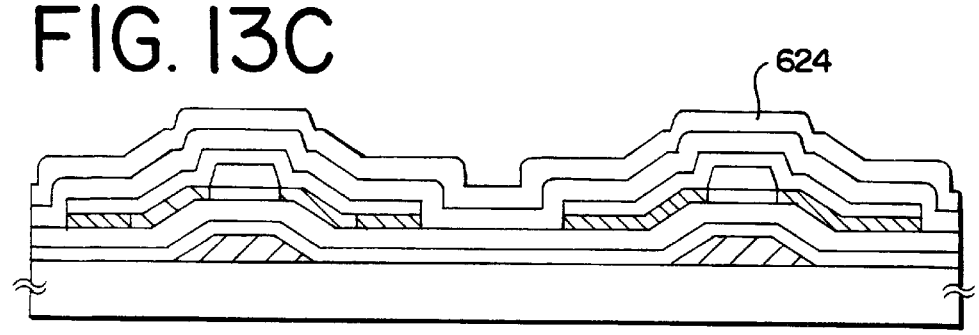
Figure 13D:
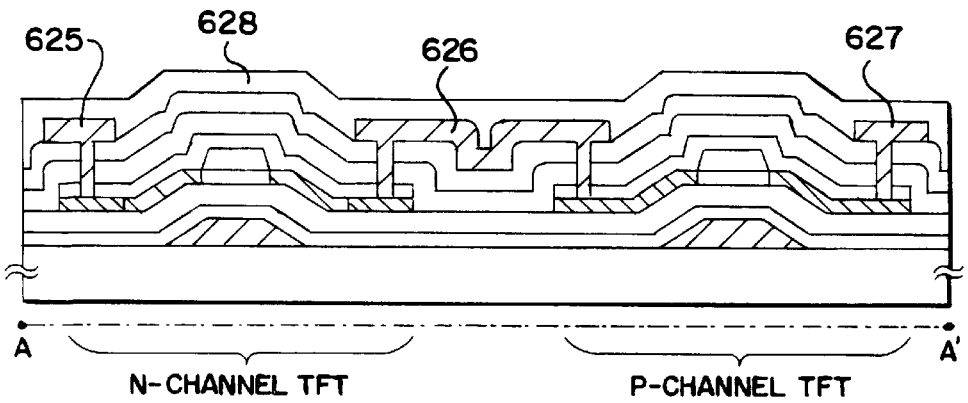

The silicon nitride oxide film and the silicon nitride film contain about 1 to 30 atomic % of hydrogen. Hydrogen contained in the films forms a Si—H bond and an N—H bond, and the mode of bondage can be observed through FT-IR. This hydrogen can be emitted outside the film by heat-treatment at a temperature of not lower than 300° C. FIG. 10 shows the change of the hydrogen bonds when the silicon nitride oxide film fabricated by the use of $SiH_4$, $N_2O$ and $NH_3$ as the starting materials at a substrate temperature of 300 to 400° C. is heat-treated at 500° C. The change of the hydrogen bond can be observed mainly as the decrease of hydrogen forming the Si—H bond before and after the heat-treatment. The change quantity can be estimated as about 10 to about 30%. Presumably, hydrogen atoms having weaker bonding power are successively cut off and are emitted.

Therefore, in the process steps shown in FIGS. 9(A) to 9(D), hydrogen that is contained in the first, second and third insulating films and hydrogen that is introduced afresh by the hydrogenation treatment are easily allowed to move from the respective regions when the heat-treatment is carried out at a temperature higher than 300° C. A part of such hydrogen can reach the semiconductor layer and can neutralize its defect. At this time, the third insulating film as the uppermost layer preferably comprises a compact film of the silicon nitride oxide film or the silicon nitride film. Such a construction can restrict the emission of hydrogen to the gaseous phase outside films due to the heat-treatment and enhances the hydrogenation effect of the semiconductor layer.

Figure 15:
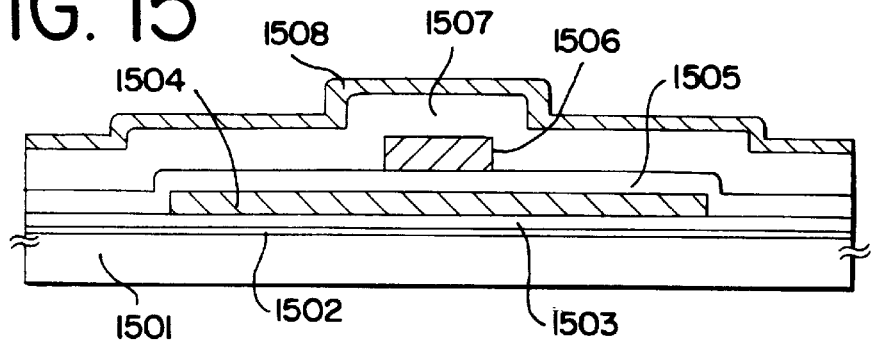
FIG. 15 is an explanatory view of another embodiment of the present invention.

FIG. 15 shows another embodiment of the present invention. Underlying films 1502 and 1503, a semiconductor layer 1504 and a gate insulating film 1505 are formed over a substrate 1501, and a first insulating film 1507 and a third insulating film 1508 are formed over the former. The first insulating film 1507 is a silicon nitride oxide film having a hydrogen content of 1 to 30 atomic % and a third insulating film 1508 is preferably a compact film of a silicon nitride oxide film or a silicon nitride film using a plasma CVD process. A plasma hydrogen treatment for introducing hydrogen or ammonia may be carried out prior to the formation of the third insulating film. Hydrogen is introduced into the first insulating film by the plasma hydrogenation treatment. Thereafter, heat-treatment is carried at 300 to 550° C. for 1 to 12 hours in an atmosphere containing hydrogen or nitrogen, thereby achieving hydrogenation of the semiconductor layer.

The embodiments of the present invention described above diffuse hydrogen from the third insulating film to the second insulating film, from the second insulating film to the first insulating film and from the first insulating film to the semiconductor layer when the hydrogenation treatment and the heat-treatment are conducted. Therefore, this embodiment can effectively accomplish hydrogenation of the semiconductor layer.

EXAMPLES

Example 1

An example of the present invention will be explained in detail about an inverter circuit as the basic construction of a CMOS circuit, by way of example, with reference to FIGS. 1 and 2. Referring to FIG. 1(A), underlying films 102 and 103 are shown formed over a substrate 101 having an insulating surface. The underlying film 102 is a nitrogen-rich silicon nitride oxide film having a nitrogen concentration of at least 25 atomic % to less than 50 atomic %, and its thickness is 20 to 100 nm and typically 50 nm. The underlying film 103 is a silicon nitride oxide film having a nitrogen concentration of at least 5 atomic % to less than 25 atomic %, and its thickness is 50 to 500 nm, typically 150 to 200 nm. A first island-like semiconductor film 105, a second island-like semiconductor film 104 and a gate insulating film 106 are formed over the former. The island-like semiconductor films are acquired by separating into an island shape the crystalline semiconductor film that is in turn formed by crystallizing an amorphous semiconductor film by laser crystallization or thermal crystallization, by a known technology. The crystalline semiconductor film is formed hereby from the amorphous semiconductor film by a crystallization method using a catalytic element. Semiconductor materials that can be used hereby include silicon (Si), germanium (Ge), a silicon-germanium alloy and silicon carbide. Compound semiconductors such as gallium arsenic can be used, too. The semiconductor film may be formed to a thickness of 10 to 100 nm, typically 50 nm (FIG. 1(A)).

The amorphous semiconductor film fabricated by the plasma CVD process contains hydrogen in a proportion of 10 to 40 atomic % and neutralizes the defects in the film. However, the major proportion of hydrogen is emitted with the progress of the crystallization process. In consequence, a large number of defects remain in the crystal grain boundary, though the defects in the crystal grains can be decreased.

Channel formation regions of the second and first island-like semiconductor films 104 and 105 and resist masks 107 and 108 are then formed. At this time, a resist mask 109 may also be formed in a region in which wiring is to be later formed. A process step of forming impurity regions 110 and 111 by adding an n type imparting impurity element is carried out. Here, phosphorus (P) is added by ion doping using phosphine ($PH_3$). The concentration of phosphorus added to the impurity regions 110 and 111 is preferably within the range of $1 \times 10^{16}$ to $1 \times 10^{19}$ atoms/cm$^3$, and is hereby $1 \times 10^{18}$ atoms/cm$^3$. A part of this region is to function as an LDD region (FIG. 1(B)).

A Si film 112 having a thickness of 5 to 20 nm, a WN (tungsten nitride) film 113 having a thickness of 100 to 200 nm and a W film 114 having a thickness of 100 to 200 nm are formed over the entire surface of the gate insulating film 106. There is no limitation to the method of forming these films, in particular, and the films can be formed by sputtering, for example. The Si film 112 is formed in order to improve adhesion of the WN film 113 with the base, and the WN film 113 can prevent the Si film 112 from reacting and alloying with the W film 114. Furthermore, the WN film 113 can contribute greatly to the increase of the crystal grain size of the W film 114 and to the decrease of the resistance (FIG. 1(C)).

Next, resist masks 115 to 118 are formed. The resist mask 115 is for forming a gate electrode of a p-channel TFT, and the resist masks 117 and 118 are for forming extension lead wires that are disposed for a gate wiring, a gate bus line and lines around them. The resist mask 116 is so formed as to cover the entire surface of the first island-like semiconductor film 105, and functions as a mask for impeding the addition of the impurity in the next process step. Dry etching is conducted using these resist masks, forming the second gate electrode 119, the gate wiring 121 and the extension wiring 122. These gate electrodes and wiring are formed as the Si film, the WN film and the W film that are formed previously are integrated with one another. Etching may use a chlorine type or fluorine type etchant gas. If any etching residue remains, ashing treatment is preferably made. The resist masks 115 to 118 are left as such, and impurity regions 123 and 124 are formed at a part of the second island-like semiconductor film 104, at which a p-channel TFT is to be formed, by adding a p type imparting impurity element. Boron is selected hereby as the impurity element, and ion doping is conducted using diborane ($B_2H_6$). The boron concentration is $2 \times 10^{20}$ atoms/cm$^3$. There are thus formed the impurity regions 123 and 124 containing boron in a high concentration as shown in FIG. 1.(D).

Next, a first gate electrode 128 of the n-channel TFT is formed by forming resist masks 125 to 127. At this time, the first gate electrode 128 is formed in such a fashion as to overlap with a part of the impurity regions 110 and 111 through the gate insulating film (FIG. 1(E)).

Resist masks 129 to 131 are then formed. A part of the gate insulating film 106 is etched away using the resist masks, exposing a part of the island-like semiconductor layers 104 and 105. The resist mask 130 is formed in such a fashion as to cover the first gate electrode 128 and to overlap with a part of the impurity regions 110 and 111. This portion decides the offset quantity of the LDD region. A process step for forming the first impurity region is carried out by adding an n type imparting impurity element, forming thereby an impurity region 138 to serve as a source region in the n-channel TFT and an impurity region 137 to serve as a drain region. The P concentration in these regions is preferably from $1 \times 10^{19}$ to $1 \times 10^{21}$ atoms/cm$^3$ and is hereby $1 \times 10^{20}$ atoms/cm$^3$. P-doped regions 135 and 136 are also formed at a part of the second semiconductor layer 104 that forms the p-channel TFT in the same impurity concentration (FIG. 2(A)).

A first insulating film 139 of a silicon nitride oxide film is formed over the surfaces of the gate insulating film 106, the first and second gate electrodes 128 and 119, the gate wiring 121 and the extension wiring 122 by a plasma CVD process using $SiH_4$, $N_2O$ and $NH_3$. Though the method of forming this film is not particularly limited, it is formed to a thickness of 100 to 500 nm at a substrate temperature of 200 to 400° C. In any case, it is preferred to limit the hydrogen concentration in the film to 1 to 30 atomic % and the nitrogen concentration to 10 to 25 atomic %. Because a gas such as TEOS is not used hereby, the carbon concentration in the film is not higher than $2 \times 10^{19}$ cm$^{-3}$ when measured by a secondary ion mass analysis (SIMS).

Next, a process step for activating the n or p imparting impurity element added in a respective concentration is carried out. This step may be conducted by a thermal annealing method using an electric heating furnace, the aforementioned laser annealing method using the excimer laser or a rapid thermal annealing method (RTA) using a halogen lamp. Here, activation is conducted by the thermal annealing method. The heat-treatment is carried out at 300 to 600° C., preferably at 450 to 550° C., and at 550° C. hereby, for 2 hours in the nitrogen atmosphere. The catalytic element used for the crystallization process remains in the island-like semiconductor layers 104 and 105, but it can be segregated to the P-doped regions 135 to 138 and can be gettered from the channel formation region simultaneously with this heat-treatment.

However, when the heat-treatment is carried out at 550° C., a part of hydrogen in the island-like semiconductor layers 104 and 105 and in the first insulating film 139 is emitted into the gaseous phase. Therefore, the first hydrogenation step is preferably carried out hereby. This step can be carried out in a hydrogen atmosphere of 3 to 100% at 300 to 550° C., preferably at 350 to 450° C., for 1 to 12 hours. Alternatively, the heat-treatment may be carried out in an atmosphere containing hydrogen converted to the plasma, at a temperature of 200 to 500° C. for 5 to 120 minutes. Hydrogen supplied to the first insulating film diffuses and its part reaches the semiconductor layer. Therefore, hydrogenation can be accomplished in this step (FIG. 2(B)).

Next, the second insulating film 140 is formed by the plasma CVD process using $SiH_4$ and $N_2O$ as the starting material at a substrate temperature of 200 to 400° C. After a predetermined resist mask is formed, the first and second insulating film 139 and 140 are etched so as to form contact holes reaching the source region and the drain region of the TFT, respectively. Source electrodes 141 and 142 and a drain electrode 143 are then formed. This embodiment uses electrodes having a three-layered structure of a 100 nm-thick Ti film, a 300 nm-thick Al film containing Ti and a 150 nm-thick Ti film acquired by continuous sputtering, as the electrodes, though they are not shown in the drawings.

Next, a process step for forming the third insulating film 144 is carried out. The third insulating film is a silicon nitride oxide film formed from $SiH_4$, $N_2O$ and $NH_3$ by the plasma CVD process or a silicon nitride film formed from $SiH_4$, $N_2$ and $NH_3$. The plasma hydrogenation treatment is conducted by introducing $N_2O$, $N_2$, $NH_3$, etc, prior to the formation of the film. Here, hydrogen formed in the gaseous phase as a result of plasma generation is supplied also into the second insulating film. If the substrate is heated in advance to 200 to 500° C., hydrogen is allowed to diffuse into the first insulating film and the lower layer below the first insulating film, thereby achieving the second hydrogenation step. The formation condition of the third insulating film is not particularly limited, but the film is preferably a compact film. Finally, the third hydrogenation step is carried out as the heat-treatment at 300 to 550° C. for 1 to 12 hours in an atmosphere containing hydrogen or nitrogen. At this time, hydrogen diffuses from the third insulating film into the second insulating film, from the second insulating film into the first insulating film and from the first insulating film to the semiconductor layer and in this way, hydrogenation of the semiconductor layer can be accomplished effectively. Hydrogen is also emitted from inside the film into the gaseous phase, but this emission can be prevented to a certain extent if the third film is made of a compact film. Alternatively, the loss of hydrogen can be supplemented by supplying hydrogen into the atmosphere.

After the process steps described above are completed, the p-channel TFT is formed in self alignment while the n-channel TFT is formed in non-self alignment. The channel formation region 150, the first impurity regions 151 and 154 and the second impurity regions 152 and 153 are formed in the n-channel TFT of the CMOS circuit. Regions (GOLD regions) 152a and 153a that overlap with the gate electrode and regions (LDD regions) 152b and 153b that do not overlap with the gate electrode are formed in the second impurity regions, respectively. The first impurity region 151 serves as the source region and the first impurity region 154, as the drain region. On the other hand, the channel formation region 145 and the third impurity regions 146 to 149 are formed in the p-channel TFT. Of the third impurity regions, only boron is added to the regions 147 and 148 that keep contact with the channel formation region, and the regions to which both boron and phosphorus are added are formed in the outside regions 146 and 149. However, because the phosphorus concentration of the regions is about a half of the boron concentration, the regions are substantially of the p type. The third impurity regions 146 and 147 serve as the source region and the third impurity regions 148 and 149, as the drain region (FIG. 2(C)).

Figure 2A:
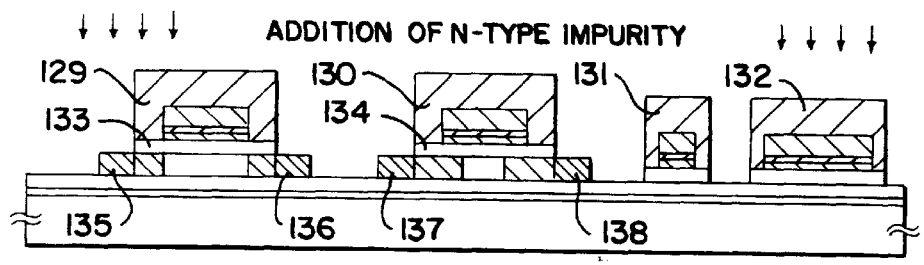
FIG. 2 is a sectional view showing the fabrication process of the TFT and is a top view of a CMOS circuit.
Figure 2B:
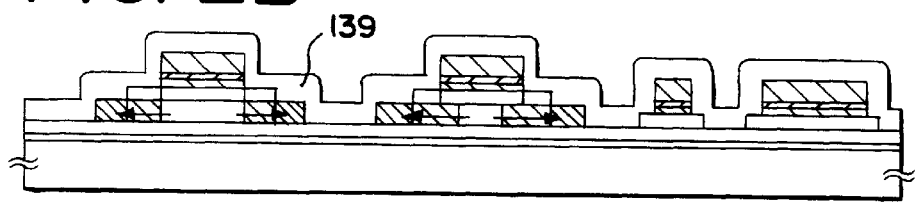
Figure 2C:
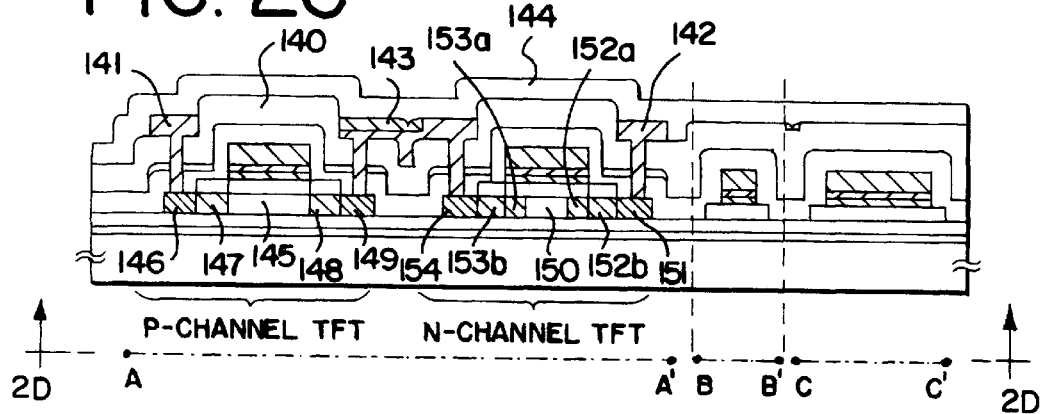
Figure 2D:
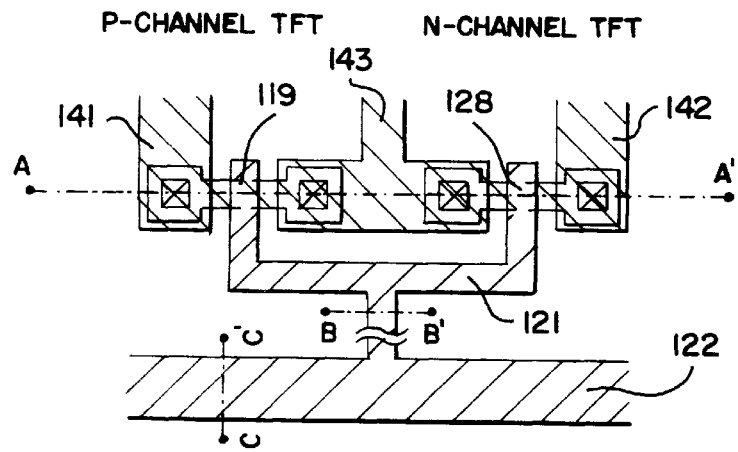

FIG. 2(D) is a top view of an inverter circuit. A sectional structure of the TFT portion along a line A–A', a B–B' sectional structure of the gate wiring portion and a C–C' sectional structure of the gate bus line portion correspond to those shown in FIG. 2(C). In the present invention, the gate electrode, the gate wiring and the gate bus line are made of the first conductor layer. FIGS. 1 and 2 typically show the CMOS circuit that comprises the complementary combination of the n-channel TFT with the p-channel TFT. However, the present invention can be applied also to an NMOS circuit using the n-channel TFTs, a pixel matrix circuit of a liquid crystal display device, an EL display device, a read circuit of an image sensor, and so forth.

Example 2

Figure 5A:
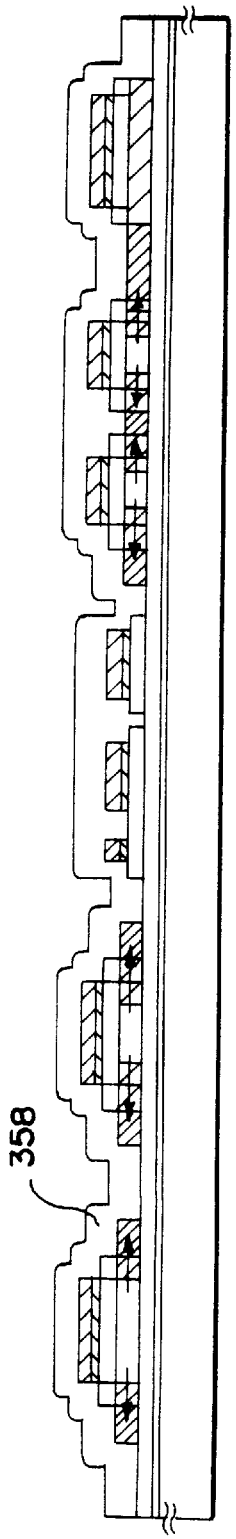
FIG. 5 is a sectional view showing a fabrication process of an active matrix substrate.

In this example, a method of fabricating an active matrix substrate having a pixel matrix circuit and a CMOS circuit as a basic form of a driving circuit disposed around, and formed simultaneously with, the pixel matrix circuit, will be explained with reference to FIGS. 3 to 5. First, a nitrogen-rich silicon nitride oxide film 302a is formed as a first insulating layer on a substrate 301 to a thickness of 50 to 500 nm, typically to a thickness of 100 nm. A silicon nitride oxide film 302b is formed further to a thickness of 100 to 500 nm, typically to a thickness of 200 nm. The nitrogen-rich silicon nitride oxide film 302a has a nitrogen concentration of at least 25 atomic % to less than 50 atomic %. The silicon nitride oxide film 302b is produced from $SiH_4$, $N_2O$ and $NH_3$. Island-like crystalline semiconductor films 303, 304 and 305 and a gate insulating film 306 are further formed. The island-like crystalline semiconductor films are obtained by crystallizing an amorphous semiconductor film by using a catalytic element and separating the film into the island form. The gate insulating film 306 is a silicon nitride oxide film produced from $SiH_4$ and $N_2O$ and is formed to a thickness of 10 to 200 nm, preferably 50 to 150 nm (FIG. 3(A)).

Next, resist masks 307 to 311 that cover the channel formation regions of the island-like semiconductor films 303, 304 and 305 are formed. At this time, the resist mask 309 may be formed in a region for forming a wiring, too. An n type imparting impurity element is added so as to form impurity regions 312 to 316. Phosphorus (P) is added by ion doping using phosphine ($PH_3$). In this process step, phosphorus is introduced into the island-like semiconductor film below the gate insulating film 306 through this film 306. Therefore, an acceleration voltage is set to 65 keV. The concentration of phosphorus added to the island-like semiconductor is preferably within the range of $1\times10^{16}$ to $1\times10^{19}$ atoms/cm$^3$ and is hereby set to $1\times10^{18}$ atoms/cm$^3$. There are thus formed the P-doped impurity regions 312 to 316. A part of the regions is to serve as the second impurity region that functions as the LDD region (FIG. 3(B)).

Thereafter, the resist mask is removed, and a tantalum nitride (TaN) film 317 and a tantalum (Ta) film 318 are formed by sputtering to a thickness of 10 to 50 nm and 100 to 300 nm, respectively, in order to form a gate electrode. Here, Ta is sputtered using a mixed gas of Ar and Xe (FIG. 3(C)).

Next, resist masks 319 to 324 are formed, and a gate electrode of a p-channel TFT, gate wiring of the CMOS circuit and the pixel matrix circuit and the gate bus line are formed. Unnecessary portions of the TaN film 317 and the Ta film 318 are etched away by dry etching. Etching of the TaN film and Ta film is conducted by using a mixed gas of $CF_4$ and $O_2$. There are thus formed the gate electrode 325 of the p-channel TFT, the gate wiring 327 and the extension wiring 328 and 329. The resist masks 319 to 324 are left as such, and a process step for adding an impurity element for imparting the p type is carried out for a part of the island-like semiconductor films on which the p-channel TFT is formed. Here, boron is selected as the impurity element, and ion doping is conducted using diborane ($B_2H_6$). The boron concentration of this region is set to $2×10^{20}$ atoms/cm$^3$. There is thus formed the impurity regions 331 and 332 doped with boron in a high concentration as shown in FIG. 4(A).

After the resist masks disposed in FIG. 4(A) are removed, resist masks 333 to 339 are formed afresh. These resist masks are for forming the gate electrodes of the n-channel TFTs, and the gate electrodes 340 to 342 are formed by dry etching. At this time, the gate electrodes 340 to 342 are formed in such a fashion as to overlap with a part of the impurity regions 312 to 316. Holding capacitance electrodes 343 are formed simultaneously in the regions of the semi-conductor layer 305 on which the pixel TFTs are formed (FIG. 4(b)).

Next, new resist masks 344 to 350 are formed. The resist masks 345, 348 and 349 are formed in such a shape as to cover the gate electrodes of the n-channel TFTs and a part of the second impurity region, and they determine the offset quantity of the LDD region. A process step is carried out by adding n type imparting impurity element, forming the impurity regions 354 and 355 to serve as the source region and the impurity regions 353, 356 and 357 to serve as the drain region. P-doped impurity regions 351 and 352 are formed at a part of the island-like semiconductor layer 303 in which the p-channel TFTs are to be formed. However, the phosphorus concentration of this region is about ½ of the boron concentration and the conductivity type remains the p type. This process step uses the resist masks 344 to 350, etches away a part of the gate insulating film and exposes the surface of the semiconductor layer to dope the impurity (FIG. 4(C)).

After the process steps up to the step shown in FIG. 4(C) are completed, the first insulating film 358 is constituted by a silicon nitride oxide film by the plasma CVD process using SiH$_4$, N$_2$O and NH$_3$ as the starting materials. This silicon nitride oxide film preferably has a hydrogen concentration of 1 to 30 atomic %. A heat-treatment is then carried out under this state in a nitrogen atmosphere at 400 to 800° C. for 1 to 24 hours, for example, at 525° C., for 8 hours. This process step can activate the n and p type impurities that have been added. The catalytic element that remains in the crystallization step can be segregated into the P-doped regions 351 to 357 as these regions function as the gettering site. As a result, the catalytic element can be removed from at least the channel formation region.

The first hydrogenation step is conducted after this heat-treatment. The hydrogenation step is conducted in a hydrogen atmosphere of 3 to 100% at 300 to 500° C., preferably 350 to 450° C., for 2 to 12 hours. The hydrogenation step may be conducted using hydrogen that is formed by plasma generation, at a substrate temperature of 200 to 500° C., preferably 300 to 450° C. In any case, hydrogen supplied into the first insulating film by this treatment diffuses and a part of this hydrogen can hydrogenate the semiconductor layer (FIG. 5(A)).

The second insulating film 359 is formed by the plasma CVD process using SiH$_4$ and N$_2$O as the starting material at a substrate temperature of 200 to 400° C. After predetermined resist masks are formed, the first and second insulating films 358 and 359 are etched so as to form the contact holes reaching the source and drain regions of the TFT, respectively. The source electrodes 360 and 363 and the drain electrodes 362 and 364 are then formed. An electrode having a three-layered structure of a 100 nm-thick Ti film, a 300 nm-thick Ti-containing Al film and a 150 nm-thick Ti film is used as each of the electrodes, though the electrode is not shown in the drawing.

The third insulating film 365 is then formed from above. The third insulating film may comprise a silicon nitride oxide film formed by the plasma CVD process from SiH$_4$, N$_2$O and NH$_3$ or a silicon nitride film formed from SiH$_4$, N$_2$ and NH$_3$. Prior to the film formation, the second hydrogenation step is conducted by plasma hydrogenation treatment by introducing N$_2$O, N$_2$, NH$_3$ and so forth. Hydrogen that is formed in the gaseous phase by plasma generation is supplied also into the second insulating film. When the substrate is heated in advance to 200 to 400° C., hydrogen can be supplied also to the first insulating film and to the lower layers beneath the first insulating film. The fabrication condition of the third insulating film is not limited, in particular, but the third insulating film is preferably a compact film. Finally, the third hydrogenation step is conducted by heat-treatment in an atmosphere containing hydrogen or nitrogen at 300 to 550° C. for 1 to 12 hours. At this time, hydrogen diffuses from the third insulating film into the second insulating film, from the second insulating film into the first insulating film and then from the first insulating film into the semiconductor layer, and hydrogenation of the semiconductor layer can be accomplished effectively. Hydrogen is emitted from inside the films into the gaseous phase, too, but this emission can be prevented to a certain extent if the third insulating film comprises a compact film, and the loss of hydrogen can be supplemented by supplying hydrogen into the atmosphere.

As a result of the process steps described above, the p-channel TFT is formed in self alignment while the n-channel TFT is formed in non-self alignment. In the n-channel TFT of the CMOS circuit are formed the channel formation region 371, the first impurity regions 373 and 374 and the second impurity regions 372 and 373. Here, a region (GOLD region) 372a overlapping with the gate electrode and a region (LDD region) 372b not overlapping with the gate electrode are formed in the second impurity regions. The first impurity region 373 serves as the source region and the first impurity region 374, as the drain region. In the p-channel TFT are formed the channel formation region 368 and the third impurity regions 369 and 370. The third impurity region 369 serves as the source region and the third impurity region 370, as the drain region. The n-channel TFT of the pixel matrix circuit has a multi-gate structure, and there are formed the channel formation regions 374 and 375, the first impurity regions 377 and 378 and the second impurity region 376. A region 376a overlapping with the gate electrode and a region 376b not overlapping with the gate electrode are formed in the second impurity regions. An impurity element for imparting the n type is doped into the drain side of the n-channel TFT of the pixel matrix circuit in the same concentration as the second impurity region. There are formed the low concentration impurity region 379, the gate insulating film 306 and the holding capacitance electrode 343, and a holding capacitance provided to the pixel matrix circuit is formed simultaneously.

Figure 5B:
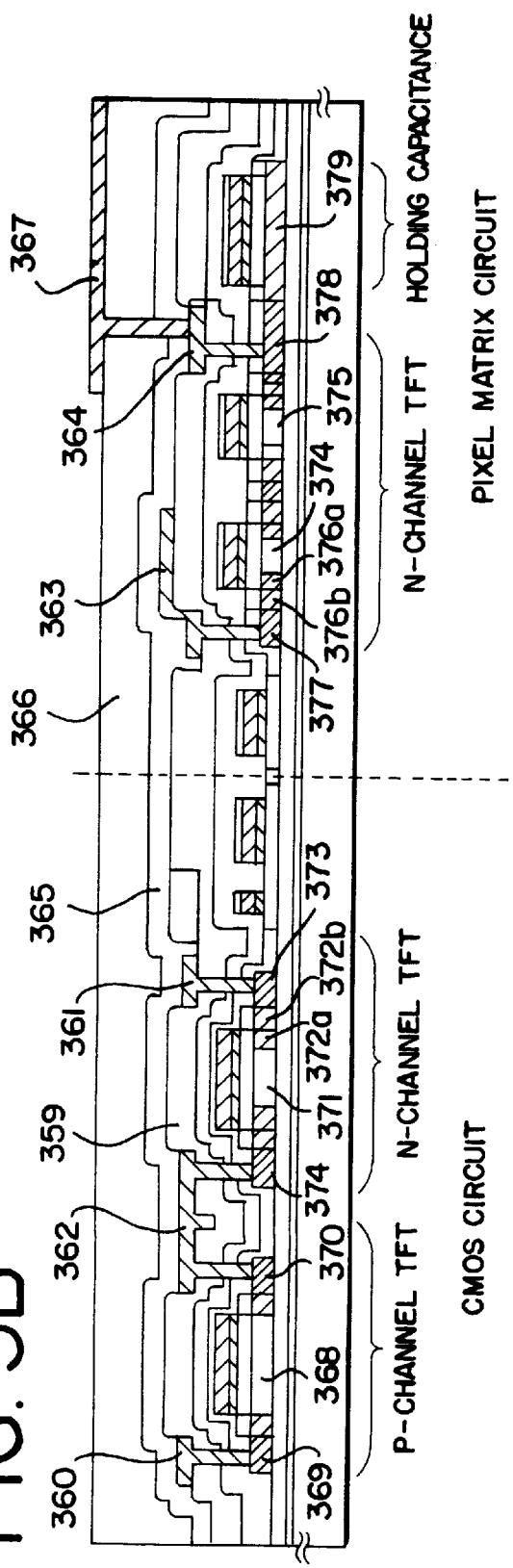

An inter-layer insulating film 366 made of an organic resin is formed to a thickness of about 1,000 nm over the third insulating film. BCB, polyimide, acryl, polyimidamide, or the like, can be used for the organic resin film. The advantages of the use of the organic resin film are that the film formation method is simple and easy, the parasitic capacitance can be reduced because the specific dielectric constant is low, and planarity is high. Organic resin films other than those described above can be used, as well. This example uses the polyimide of the type that can be thermally polymerized after applied to the substrate, and is fired at 300° C. to form the film. Contact holes reaching the drain electrodes 364 are bored in the inter-layer insulating film 366 and pixel electrodes 367 are formed. The pixel electrode 367 uses a transparent conductive film when a transmission type liquid crystal display device is fabricated, and uses a metallic film when a reflection type liquid crystal display device is fabricated. To fabricate the transmission type liquid crystal display device, this example uses an indium tin oxide (ITO) film is formed by sputtering to a thickness of 100 nm. In this way, an active matrix substrate having the CMOS circuit and the pixel matrix circuit formed on the substrate 301 can be produced as shown in FIG. 5(B).

Example 3

Figure 6:
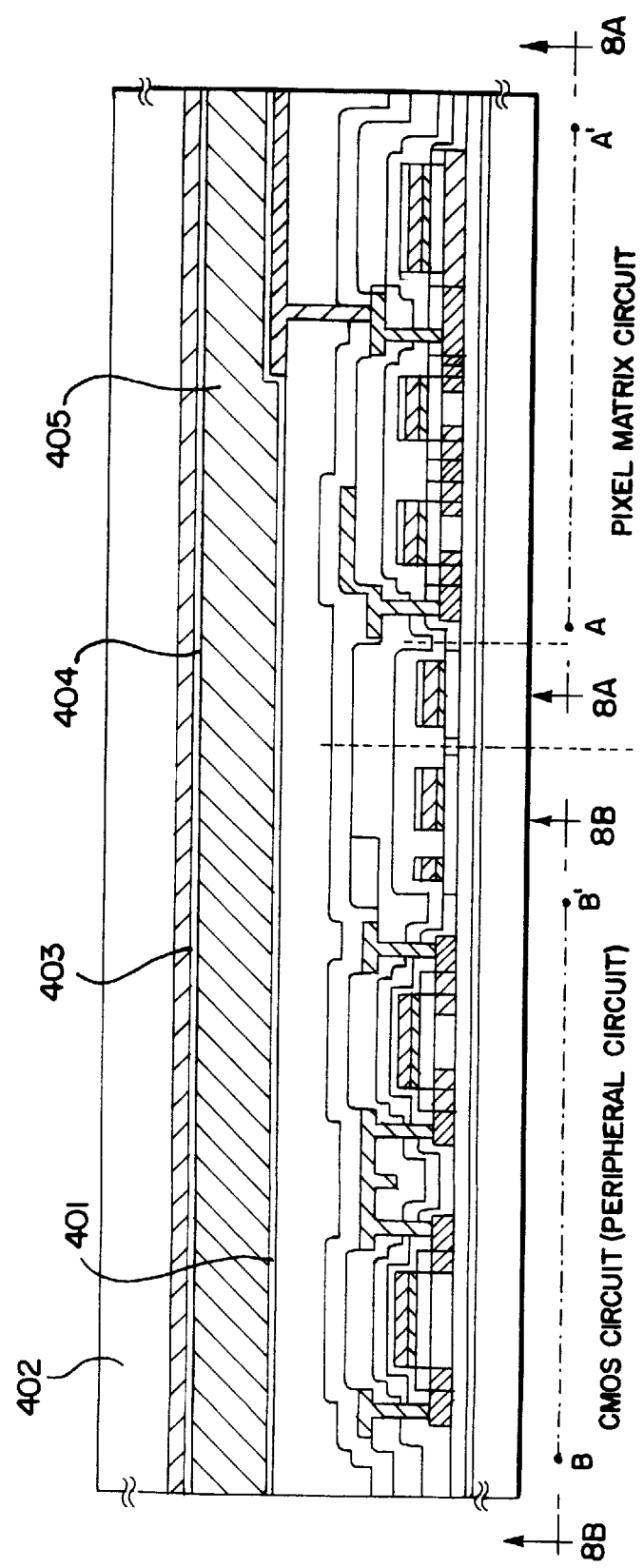
FIG. 6 is a sectional view of an active matrix type liquid crystal display device.

This example represents an example with reference to FIG. 6 where an active matrix type liquid crystal display device is fabricated from the active matrix substrate produced in Example 2. First of all, an orientation film 401 is formed on a substrate under the state shown in FIG. 5(B). A polyimide resin is used in most cases for the orientation film of the liquid crystal display device. A transparent conductive film 403 and an orientation film 404 are formed on an opposing substrate 402. After being formed, the orientation film is rubbed so that the liquid crystal molecules are arranged in parallel with a predetermined pre-tilt angle. After these steps, the active matrix substrate having the pixel matrix circuit and the CMOS circuit formed thereon and the opposing substrate are bonded to each other through a sealing material and a spacer (both are not shown) by a known cell assembly process. Thereafter, a liquid crystal material 405 is charged between both substrates and is completely sealed by a sealant (not shown). As a result, the active matrix type liquid crystal display device shown in FIG. 6 can be completed.

Figure 7:
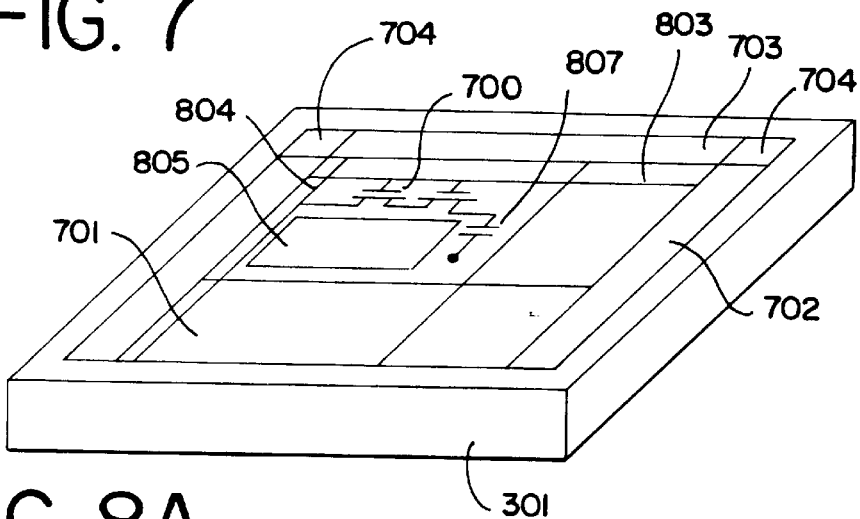
FIG. 7 is a perspective view of an active matrix substrate.

Next, the construction of the active matrix type liquid crystal display device of this example will be explained with reference to FIGS. 7 and 8. FIG. 7 is a perspective view of the active matrix substrate of this example. The active matrix substrate comprises a pixel matrix circuit 701, a scanning (gate) line driving circuit 702 and a signal (source) line driving circuit 703 that are formed on a glass substrate 301. Pixel TFTs 700 of the pixel matrix circuit are n-channel TFTs and the driving circuits disposed in the peripheral portions comprise the CMOS circuit as the basic circuit. The scanning (gate) line driving circuit 702 and the signal (source) line driving circuit 703 are connected to the pixel matrix circuit 701 through gate wiring 803 and source wiring 804, respectively.

Figure 8A:
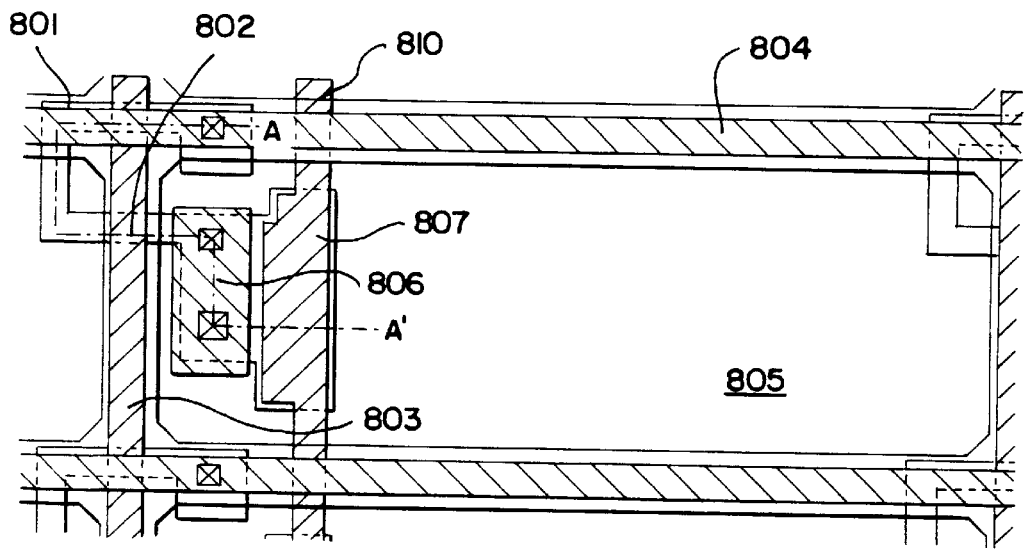
FIG. 8 is a top view of a pixel matrix circuit and is also a top view of a CMOS circuit.
Figure 8B:
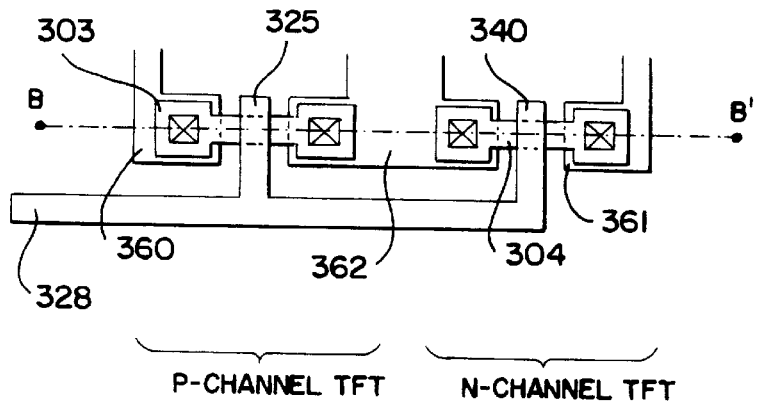

FIG. 8(A) is a top view of the pixel matrix circuit 701 and covers substantially the top view of one pixel. N-channel TFTs are disposed in the pixel matrix circuit. The gate electrode 803 that is so formed as to continue the gate wiring 803 crosses a semiconductor layer 801 below the gate electrode through a gate insulating film, not shown. The source region, the drain region and the first impurity region are formed in the semiconductor layer, though they are not shown in the drawing. A holding capacitance 807 is constituted by the semiconductor layer, the gate insulating film and the electrode made of the same material as the gate electrode on the drain side of the pixel TFT. The sectional structure along a line A–A' in FIG. 8 corresponds to the sectional view of the pixel matrix circuit shown in FIG. 6. In the CMOS circuit shown in FIG. 8(B), on the other hand, the gate electrodes 325 and 340 extending from the gate wiring 328 cross the semiconductor layers 303 and 304 below the gate wiring 328 through the gate insulating film, not shown, respectively. Though not shown in the drawing, the source region, the drain region and the LDD region are formed similarly in the semiconductor layer of the n-channel TFT. The source region and the drain region are formed in the semiconductor layer of the p-channel TFT. The sectional structure along a line B–B' showing the positional relationship corresponds to the sectional view of the pixel matrix circuit shown in FIG. 6.

The pixel TFT of this example has the double-gate structure, but it may be a single gate structure or a multi-gate structure such as a triple-gate structure. The construction of the active matrix substrate of this example is not limited, in particular, to the construction of this example. The feature of the construction of the present invention resides in the construction of the source region and the drain region of the semiconductor layer disposed through the gate insulating film and other impurity regions, and other constructions may be decided appropriately, whenever necessary.

Example 4

This example will be explained with reference to FIGS. 11 to 13. First, a glass substrate such as a Corning #1737 substrate is prepared as a substrate 601. A gate electrode 602 is then formed on the substrate 601. A tantalum (Ta) film is formed to a thickness of 200 nm by sputtering. The gate electrode 602 may have a two-layered structure comprising a tantalum nitride film (thickness of 50 nm) and a Ta film (thickness of 250 nm). The Ta film is formed by sputtering of an Ar gas and Ta as the target. When sputtering is effected using a mixed gas of the Ar gas with a Xe gas, the absolute value of the internal stress can be lowered down to $2 \times 10^9$ dyn/cm$^2$ (FIG. 11(A)).

A gate insulating film 603 and an amorphous semiconductor layer 604 are serially and continuously formed without releasing them to the atmospheric air. The gate insulating film comprises a nitrogen-rich silicon nitride oxide film 603a (thickness of 50 nm) and a silicon nitride oxide film (thickness of 125 nm). The nitrogen-rich silicon nitride oxide film 603a is formed by sputtering by the plasma CVD process that uses a mixed gas of $SiH_4$, $N_2O$ and $NH_3$. The amorphous semiconductor layer 604, too, is formed in accordance with the plasma CVD process to a thickness of 20 to 100 nm, preferably 40 to 75 nm (FIG. 11(B)).

Heat-treatment is then carried out at 450 to 550° C. for one hour. This heat-treatment emits hydrogen from the gate insulating film 603 and the amorphous semiconductor layer 604. Thereafter, the crystallization step is applied to the amorphous semiconductor layer 604 to form a crystalline semiconductor layer 605. This crystallization step may use the laser crystallization method or the thermal crystallization method. The laser crystallization method uses a KrF excimer laser beam (wavelength of 248 nm), for example, to form a linear beam. Crystallization of the amorphous semiconductor layer is executed at an oscillation pulse frequency of 30 Hz, a laser energy density of 100 to 500 mJ/cm$^2$ and an overlapping ratio of the linear beams of 96% (FIG. 11(C)).

Next, an insulating film 606 is so formed as to keep contact with the resulting crystalline semiconductor layer 605. Here, a silicon nitride oxide film is formed to a thickness of 200 nm. A resist mask 607 that keeps contact with the insulating film 606 is formed by a patterning process that uses exposure from the back. Here, the gate electrode 602 functions as the mask and the resist mask 607 can be formed in self alignment. The size of the resist mask is a little smaller than the width of the gate electrode due to turn-around of light (FIG. 11(D)). The insulating film 606 is then etched using the resist mask 607 to form a channel protection film 608, and then the resist mask 607 is etched away. This process step exposes the surface of the crystalline semiconductor layer with the exception of the region that keeps contact with the channel protection film 608. The channel protection film 608 plays the role of preventing doping of the impurity into the channel region in a subsequent impurity-doping step (FIG. 11(E)).

Next, a resist mask 609 that covers a part of the n-channel TFT and the p-channel TFT region is formed by the patterning process using a photomask. A process step of adding an n type imparting element to the region of the crystalline semiconductor layer 605 having the exposed surface is then conducted. There is thus formed a first impurity region ($n^+$ type region) 610$a$. Since this example uses phosphorus as the n type imparting impurity element, ion doping is conducted using phosphine ($PH_3$) in a dose of $5 \times 10^{14}$ atoms/$cm^2$ and at an acceleration voltage of 10 kV. The width of the $n^+$ type region can be decided appropriately depending on the pattern of the resist mask 609, and an $n^-$ region having a desired width and a channel formation region can be easily acquired (FIG. 12(A)).

After the resist mask 609 is removed, a second insulating film 611$a$ is formed. In this example, the silicon nitride oxide film (thickness of 50 nm) shown in Example 2 is formed by the plasma CVD process (FIG. 12(B)). Next, a process step for adding an n type imparting impurity element to the crystalline semiconductor layer having the mask insulating film 611 formed thereon is conducted, and the second impurity region ($n^-$ type region) 612 is formed. Because the impurity is added to the crystalline semiconductor layer below the mask insulating film 611 beneath this film 611, however, the doping condition must be set appropriately by taking the thickness of the mask insulating film 611 into account. Here, the dose is $3 \times 10^{13}$ atoms/$cm^2$ and an acceleration voltage is 60 kV The second impurity region 612 thus formed functions as the LDD region (FIG. 12(C)).

Next, a resist mask 614 for covering the n-channel TFT is formed, and a process step for adding a p type imparting impurity element to the region, in which the p-channel TFT is to be formed, is conducted. Here, boron (B) is added by ion doping using diborane ($B_2H_6$). The dose is $4 \times 10^{15}$ atoms/$cm^2$ and the acceleration voltage is 30 kV (FIG. 12(D)). Thereafter, an activation step of the impurity element by laser annealing or thermal annealing is conducted (FIG. 12(D)). The channel protection film 608 and the mask insulating film 611 are left as such, and the crystalline semiconductor layer is etched to a desired shape by a known patterning technology (FIG. 13(A)).

After the process steps described above are completed, the source region 615, the drain region 616, the LDD regions 617 and 618 and the channel formation region 619 of the n-channel TFT are formed. The source region 621, the drain region 622 and the channel formation region 620 of the p-channel TFT are formed. Next, a first insulating film 623 to cover the n- and p-channel TFTs is formed. The first insulating film 623 comprises a silicon nitride oxide film by the plasma CVD process using $SiH_4$, $N_2O$ and $NH_3$. The substrate temperature is set to 200 to 400° C. at the time of film formation so that the hydrogen concentration in the film is 1 to 30 atomic %. The film is formed to a thickness of 100 to 500 nm. The first hydrogenation step is conducted under this state. The first hydrogenation step can be conducted by heat-treatment in a hydrogen atmosphere of 3 to 100% at 300 to 550° C., preferably at 350 to 450° C., for one to 12 hours. Alternatively, the treatment may be carried out in an atmosphere containing plasma hydrogen at the same temperature as above for 10 to 60 minutes. Hydrogen supplied to the first insulating film diffuses and a part of this hydrogen reaches the semiconductor layer. In consequence, hydrogenation can be hereby accomplished (FIG. 13(B)).

A second insulating film 624 is formed next by the plasma CVD process using $SiH_4$ and $N_2O$ as the starting material at a substrate temperature of 200 to 400° C. (FIG. 13(C)). After predetermined resist masks are formed, the first and second insulating films 623 and 624 are etched to form contact holes that reach the source region and the drain region of the respective TFT. Source electrodes 625 and 627 and a drain electrode 626 are then formed. This example uses an electrode having a three-layered structure comprising a 100 nm-thick Ti film, a 300 nm-thick Ti-containing Al film and a 150 nm-thick Ti film that are continuously formed by sputtering, for each electrode, though the three-layered structure is not shown in the drawing.

A process step for forming a third insulating film 628 is conducted. The third insulating film is a silicon nitride oxide film formed by the plasma CVD process using $SiH_4$, $N_2O$ and $NH_3$ or a silicon nitride film using $SiH_4$, $N_2$ and $NH_3$. First, the plasma hydrogenation treatment is conducted by introducing $H_2$ or $NH_3$, etc into a reaction chamber of the plasma CVD apparatus, prior to the formation of the film. Hydrogen formed in the gaseous phase by plasma generation is supplied also into the second insulating film. When the substrate is heated to 200 to 500° C., hydrogen can diffuse into the first insulating film and the lower layer below the former, and the second hydrogenation step can be thus accomplished. Though the fabrication condition of the third insulating film is not particularly limited, the third insulating film is preferably a compact film. Finally, the third hydrogenation step is conducted by the heat-treatment in an atmosphere containing hydrogen or nitrogen at 300 to 550° C. for 1 to 12 hours. At this time, hydrogen diffuses from the third insulating film into the second insulating film, from the second insulating film into the first insulating film and then from the first insulating film to the semiconductor layer. In this way, hydrogenation of the semiconductor layer can be accomplished effectively. Hydrogen is emitted from inside the films into the gaseous phase. If the third insulating film comprises a compact film, however, this emission can be prevented to a certain extent, and if hydrogen is supplied into the atmosphere, the loss of hydrogen can be supplemented.

As a result of the process steps described above, the p-channel TFTs and the n-channel TFTs can be formed on the same substrate in the inverted stagger type structure.

Example 5

An example where the pixel matrix circuit of the liquid crystal display device using the n-channel TFTs in the same way as in Example 4 will be explained with reference to FIG. 14. The n-channel TFT shown in FIG. 14(A) has the inverted stagger type multi-gate structure. A gate electrode 1402 and gate insulating films 1404 and 1405 are formed from the side of the substrate, and channel formation regions 1406 and 1409, LDD regions 1407 and 1410, a source region 1408 and a drain region 1411 are formed in a semiconductor layer. The first insulating film is a silicon nitride oxide film fabricated from $SiH_4$, $N_2O$ and $NH_3$ and the second insulating layer is a silicon nitride oxide film fabricated from $SiH_4$ and $N_2O$. A source electrode 1418 and a drain electrode 1419 are further formed, and the third insulating film is a silicon nitride oxide film fabricated from $siH_4$, $N_2O$ and $NH_3$. The hydrogenation treatment may be conducted after the first insulating film is formed, or after the second insulating layer is formed, or after the third insulating layer is formed in the same way as in Example 4.

Figure 14A:
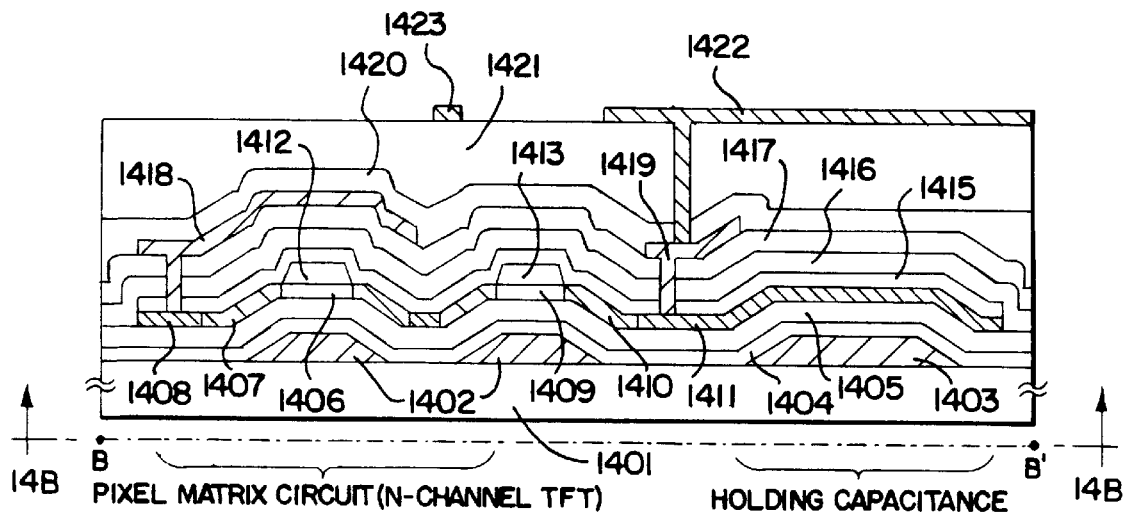
FIG. 14 is a sectional view of a pixel matrix circuit and is its top view.
Figure 14B:
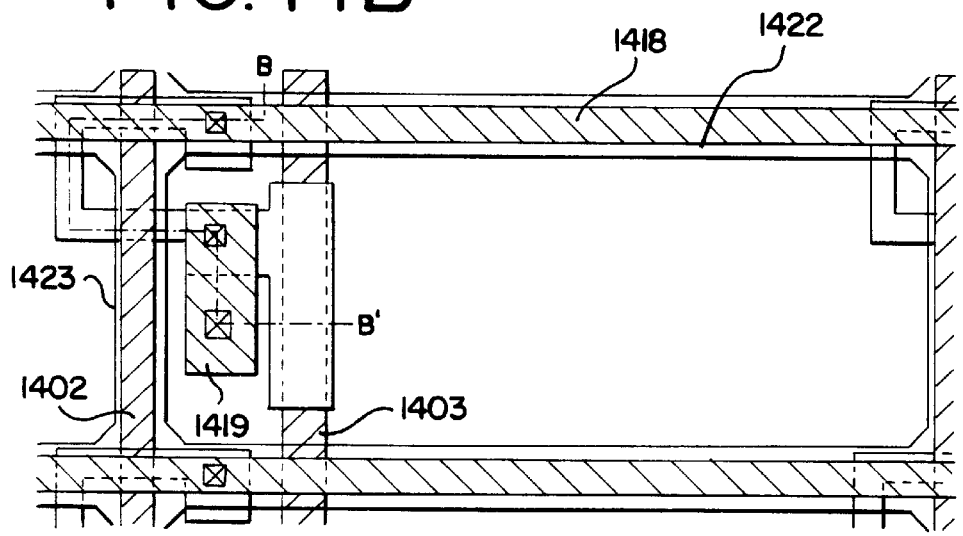

The drain region 1411 shown in FIG. 14(A) is extended in such a manner as to overlap from above with a holding capacitance electrode 1403, and forms a holding capacitance disposed for each pixel through the gate insulating films 1403 and 1404. FIG. 14(B) is a top view covering substantially one pixel of such a pixel matrix circuit. Reference numerals used in FIG. 14(B) correspond to those used in FIG. 14(A). The sectional structure along a line B–B' corresponds to FIG. 14(A).

Example 6

Figure 16A:
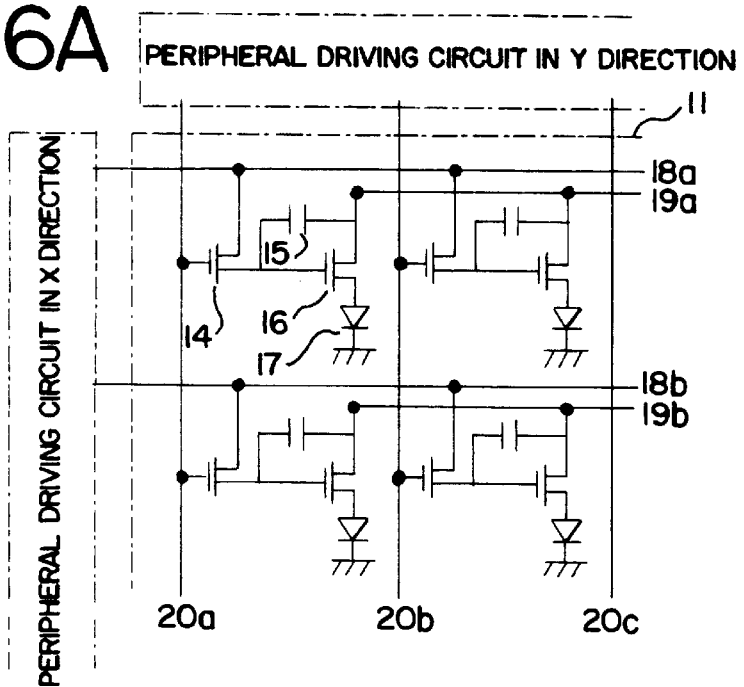
FIG. 16 is a circuit diagram of an EL panel and is its sectional structural view.

In this example, an example where the present invention is applied to an active matrix type EL display device will be explained with reference to FIGS. 16(A) and (B). FIG. 16(A) shows a circuit diagram of the active matrix type EL display device. This EL display device comprises a display region 11, an X direction peripheral driving circuit 12 and a Y direction peripheral driving circuit 13 that are disposed on a substrate 10. The display region 11 comprises a switching TFT 14, a capacitor 15, a current controlling TFT 16, an organic EL device 17, X direction signal lines 18a and 18b, power source lines 19a and 19b and Y direction signal lines 20a, 20b and 20c.

Figure 16B:
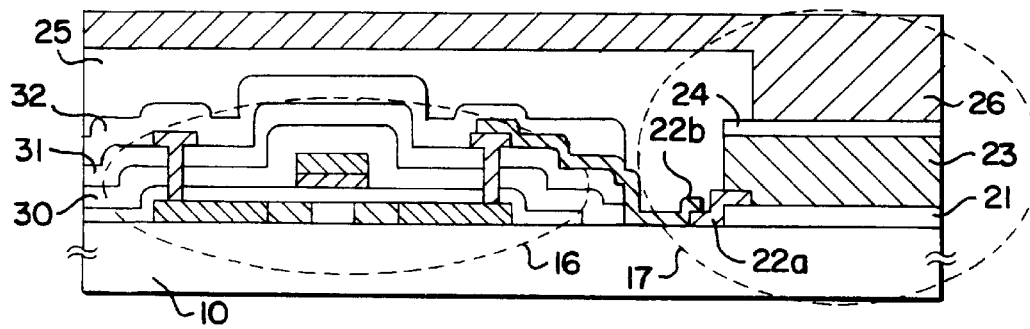

FIG. 16(B) is a partial sectional view of the display region 11 of the active matrix type EL display device. The current controlling TFT 16 and the organic EL device 17 are illustrated. The current controlling TFT 16 is an n-channel TFT, and is fabricated in the same way as in Example 1. The organic EL device 17 is disposed by removing the insulating film of the region where the TFT is not formed. The organic EL device comprises a transparent electrode 21 made of ITO, or the like, an organic EL layer 23 disposed on the transparent electrode and a top electrode 24. An inter-layer insulating film 25 is so formed as to cover the current controlling TFT 16 and a common electrode 26 is so formed as to keep contact with, and on, the top electrode 24. An electrode 22b is disposed to electrically connect the drain electrode of the current controlling TFT to the transparent electrode 21. An electrode 22a is disposed so as to keep adhesion between the electrode 22b and the transparent electrode 21.

Though this example represents the construction in which the organic EL device 17 is disposed on and in touch with the substrate 10, this construction is not particularly restrictive. For instance, the organic EL device 17 may be disposed above the TFTs through an inter-layer insulating film.

Example 7

In this example, semiconductor devices that incorporate the active matrix type liquid crystal display device by the TFT circuit according to the present invention will be explained with reference to FIG. 17.

Such semiconductor devices include portable information terminals (electronic notebooks, mobile computers, cellular telephones, etc), video cameras, still cameras, personal computers, television receivers, and so forth, and their examples are depicted in FIG. 17.

Figure 17A:
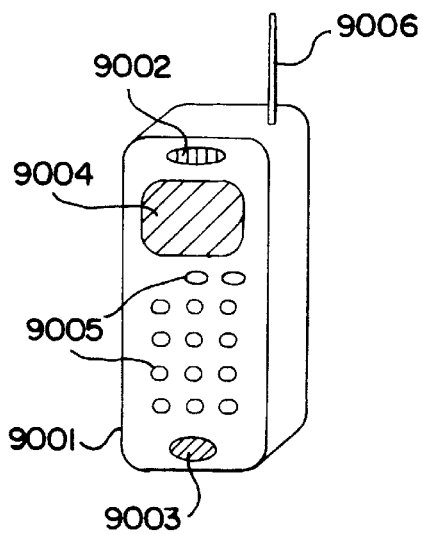
FIG. 17 is a perspective view showing an example of a semiconductor device.

FIG. 17(A) shows the cellular telephone, which comprises a main body 9001, a speech output unit 9002, a speech input unit 9003, a display device 9004, an operation switch 9005 and an antenna 9006. The present invention can be applied to the display device 9004 equipped with the speech output unit 9002, the speech input unit 9003 and an active matrix substrate.

Figure 17B:
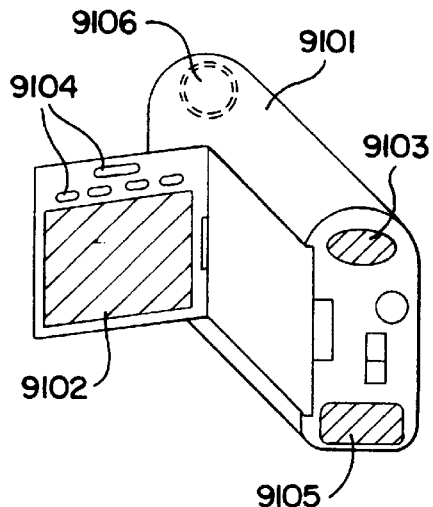

FIG. 17(B) shows the video camera, which comprises a main body 9101, a display device 9102, a speech input unit 9103, an operation switch 9104, a battery 9105 and an image receiving unit 9106. The present invention can be applied to the display device 9102 equipped with the speech input unit 9103 and the active matrix substrate and to the image receiving unit 9106.

Figure 17C:
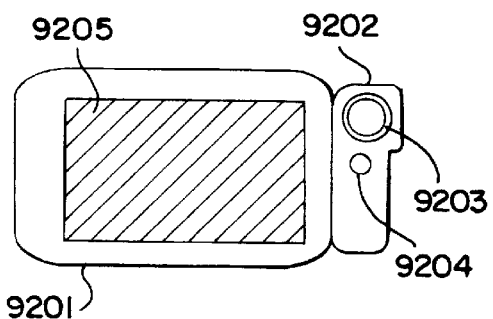

FIG. 17(C) shows the mobile computer, which comprises a main body 9201, a camera unit 9202, an image receiving unit 9203, an operation switch 9204 and a display device 9205. The present invention can be applied to the image receiving unit 9203 and to the display device 9205 equipped with the active matrix substrate.

Figure 17D:
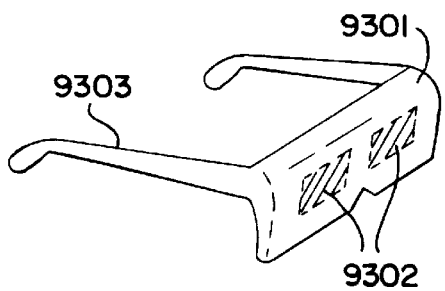

FIG. 17(D) shows the head mount display, which comprises a main body 9301, a display device 9302 and an arm unit 9303. The present invention can be applied to the display device 9302. The present invention can also be applied to other signal controlling circuits, though they are not shown in the drawings.

Figure 17E:
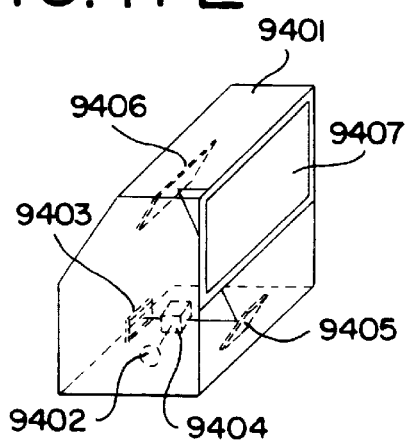

FIG. 17(E) shows the rear type projector, which comprises a main body 9401, a light source 9402, a display device 9403, a polarizing beam splitter 9404, reflectors 9405 and 9406 and a screen 9407. The present invention can be applied to the display device 9403.

Figure 17F:
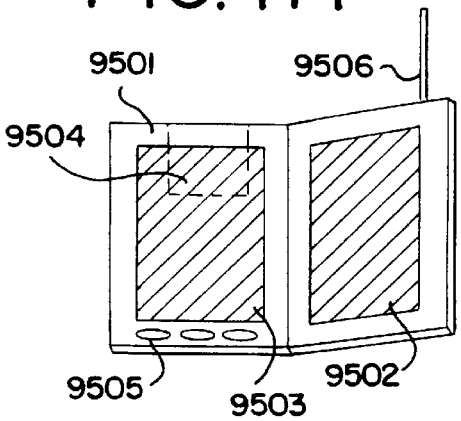

FIG. 17(F) shows the portable book, which comprises a main body 9501, display devices 9502 and 9503, a storage medium 9504, an operation switch 9505 and an antenna 9506. This book is used for displaying data stored in a mini-disk (MD) or a DVD and data received by the antenna. The display devices 9502 and 9503 are direct vision type display devices, and the present invention can be applied to these display devices 9502 and 9503.

The present invention can be further applied to the display unit of car navigation systems, image sensors and personal computers that are not shown in the drawings. Thus, the application range of the present invention is extremely broad, and the invention can be applied to electronic appliances of all fields.

Example 8

In this example, a semiconductor device incorporating an active matrix type liquid crystal display device using the TFT circuit according to the present invention will be explained with reference to FIGS. 18 and 19.

Figure 18A:
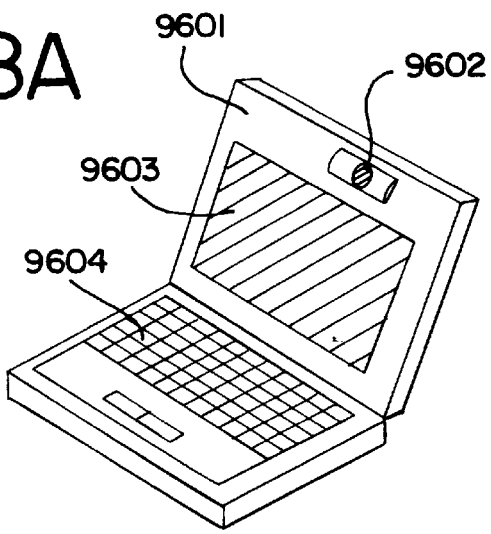
FIG. 18 is a perspective view showing another example of the semiconductor device.

FIG. 18(A) shows a personal computer, which comprises a main body 9601, an image input unit 9602, a display device 9603 and a keyboard 9604. The display device 9603 can be produced by using the active matrix type liquid crystal display device or the EL display device fabricated by using the present invention.

Figure 18B:
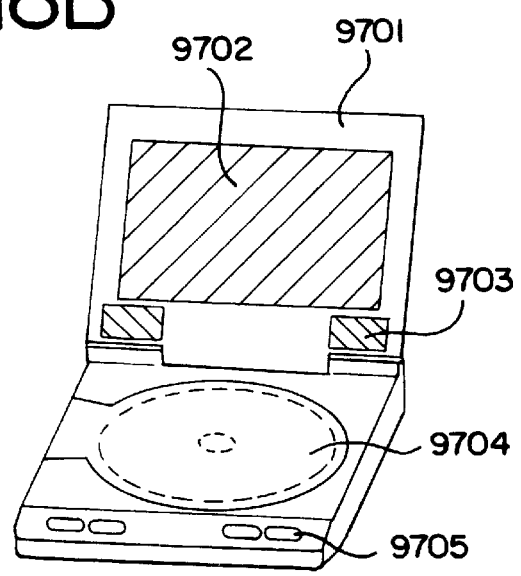

FIG. 18(B) shows the player that uses a recording medium that records a program (hereinafter called the "recording medium"), which comprises a main body 9701, a display device 9702, a speaker unit 9703, a recording medium 9704 and an operation switch 9705. Incidentally, this apparatus can enjoy listening to music, movies, games and Internet by using a DVD (Digital Versatile Disc), CD, etc, as the recording medium. The display device 9702 can be produced using the active matrix type liquid crystal display device or the EL display device that is fabricated by the present invention.

Figure 18C:
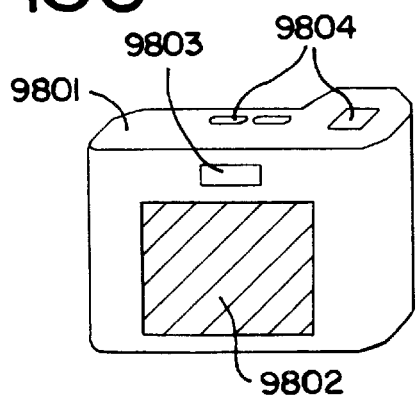

FIG. 18(C) shows the digital camera, which comprises a main body 9801, a display device 9802, an eyepiece unit 9803, an operation switch 9804 and an image-receiving unit (not shown in the drawing). The display device 9802 can be produced by the active matrix type liquid crystal display device or the EL display device that is fabricated by the present invention.

Figure 19A:
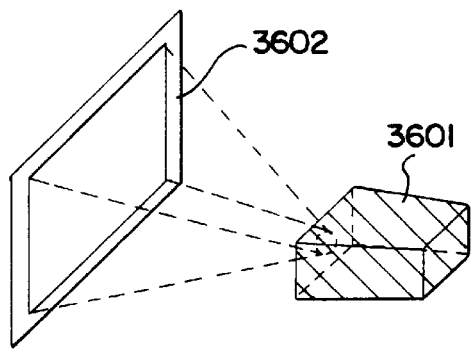
FIG. 19 is a perspective view showing a construction of a projection type liquid crystal display device.

FIG. 19(A) shows a front type projector, which comprises a projection device 3601 and a screen 3602. The liquid crystal display device according to the present invention can be assembled and used in the projection device 3601.

Figure 19B:
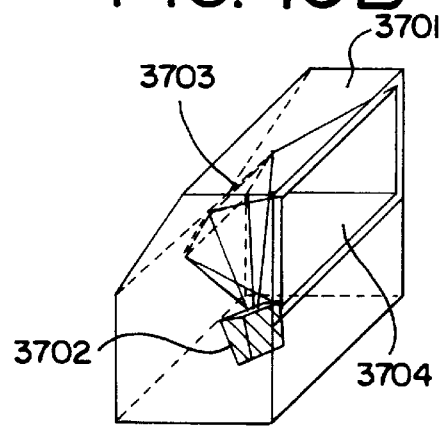

FIG. 19(B) shows a rear type projector, which comprises a main body 3701, a projection device 3702, a mirror 3703 and a screen 3704. The liquid crystal display device according to the present invention can be assembled and used in the projection device 3702.

Figure 19C:
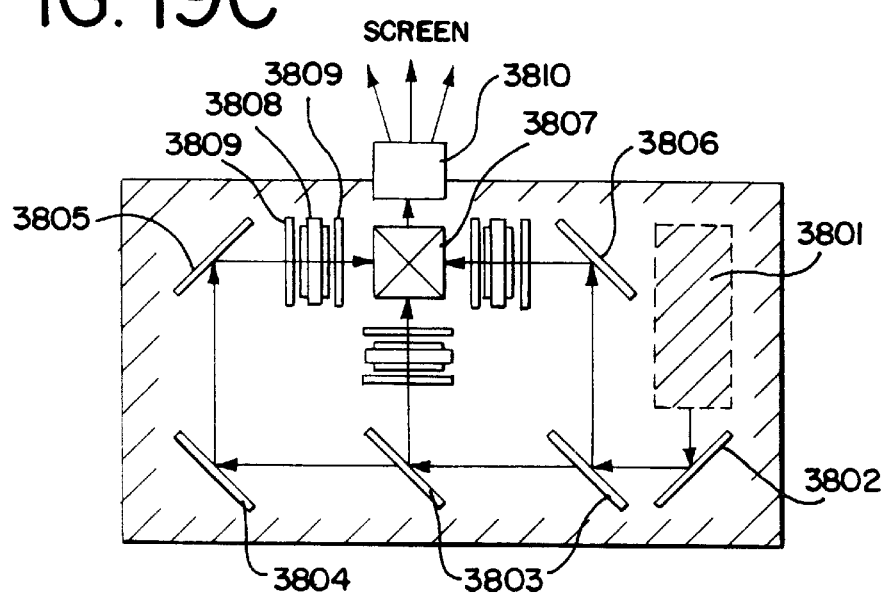

FIG. 19(C) shows an example of the construction of the projection devices 3601 and 3702 shown in FIGS. 19(A) and (B). Each projection device 3601, 3702 comprises a light source optical system 3801, a mirror 3802, 3804 to 3806, a dichroic mirror 3803, a prism 3807, a liquid crystal display device 3808, a phase difference plate 3809 and a projection optical system 3810. The projection optical system 3810 comprises an optical system including a projection lens. Though this example represents an example of the three-plate system, the construction is not limited particularly thereto but may be a single plate system, for example. An optical system such as an optical lens, a film having a polarization function, a film for adjusting the phase difference, an IR film, etc, may be disposed in the optical path indicated by an arrow in FIG. 19(C).

Figure 19D:
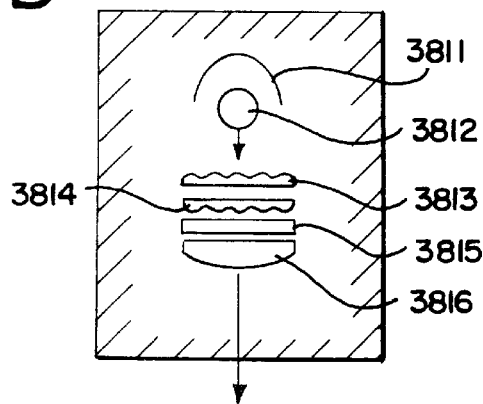

FIG. 19(D) shows an example of the construction of the light source optical system 3801 in FIG. 19(C). The light source optical system 3801 in this example comprises a reflector 3811, a light source 3812, lens arrays 3813 and 3814, a polarizing conversion element 3815 and a converging lens 3816. Incidentally, the light source optical system shown in FIG. 19(D) is merely illustrative but in no way restrictive. An optical system such as an optical lens, a film having a polarization function, a film for adjusting the phase difference, an IR film, etc, may be disposed appropriately in the light source optical system.

Example 9

Figure 20A:
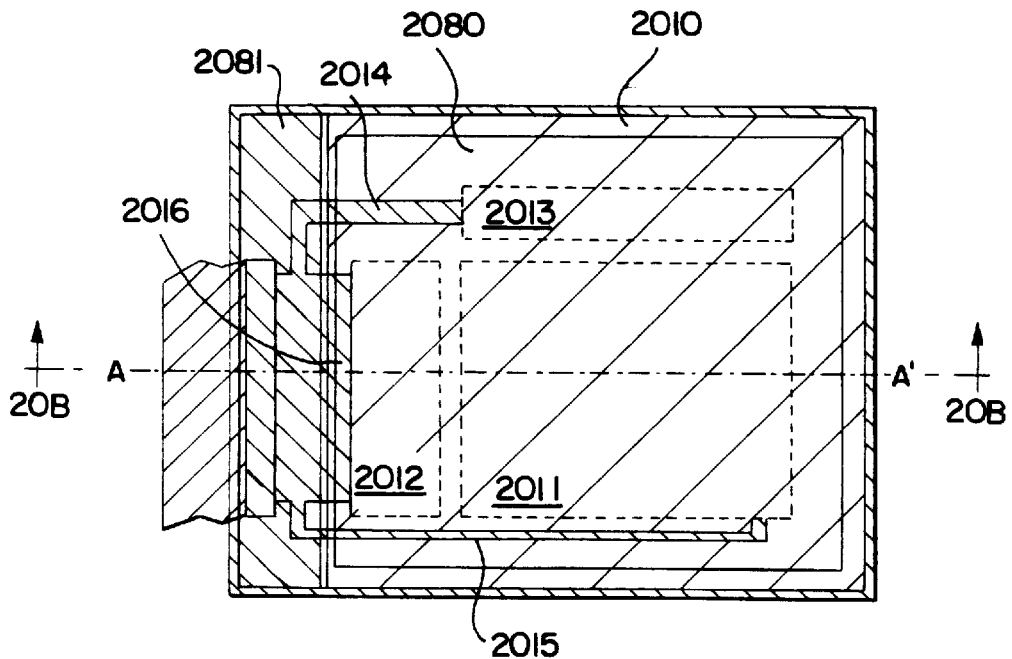
FIG. 20 is a top view and a sectional view showing a construction of an EL display device.

This example represents an example where self light emitting type display panel using an electro-luminescence material (EL) is fabricated by applying the active matrix substrate shown in FIG. 5(B). FIG. 20(A) is a top view of the display panel using the present invention. In FIG. 20(A), reference numeral 2010 denotes a substrate and reference numeral 2011 denotes a pixel unit. Reference numeral 2012 denotes a source side driving circuit and reference numeral 2013 denotes a gate side driving circuit. These driving circuits extend to an FPC 2017 through lead wires 2014 and 2016 and are connected to an external appliance.

Figure 20B:
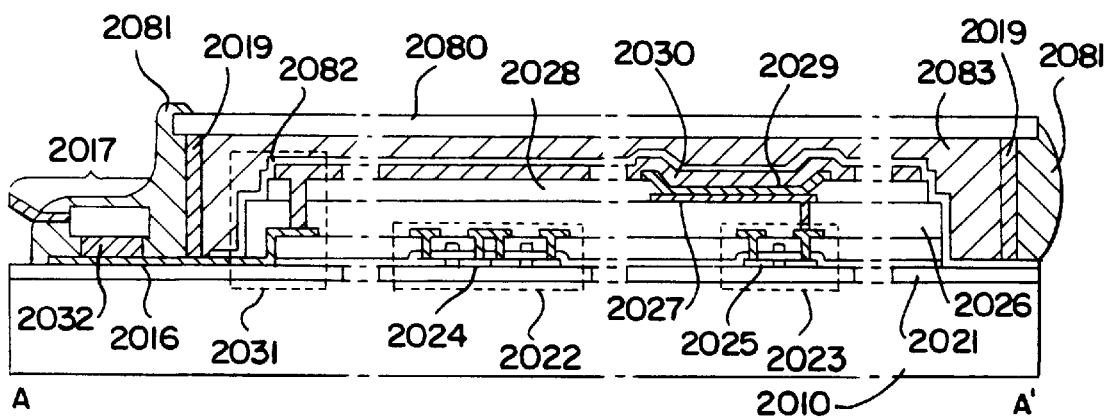

FIG. 20(B) shows the section taken along a line A–A' of FIG. 20(A), and an opposing plate 2080 is disposed over at least the pixel unit, preferably over the driving circuits and the pixel unit. The opposing plate 2080 is bonded by a sealing material 2019 to the active matrix substrate on which the TFTs and the EL layer are formed. The sealing material 2019 contains a filler (not shown), and the two substrates are bonded while keeping a substantially uniform spacing by this filler. The outside of the sealing material 2019 and the upper surface and the peripheral portion of the FPC 2017 are sealed by a sealant 2081. The sealant 2081 uses a material such as a silicone resin, an epoxy resin, a phenol resin, a butyl rubber, or the like.

When the active matrix substrate 2010 and the opposing substrate 2080 are bonded by the sealing material 2019 as described above, a space is defined between them. A packing agent 2083 is packed into this space. The packing agent has also the function of bonding the opposing plate 2080. The packing agent 2083 can use PVC (polyvinyl chloride), an epoxy resin, a silicone resin, PVB (polyvinyl butyral) or EVA (ethylene vinyl acetate). Since the EL layer is weak to the moisture and is likely to get deteriorated, a desiccating agent such as barium oxide is preferably contained in the packing agent 2083 in order to keep the hygroscopic effect. A passivation film 2082 comprising a silicon nitride film or a silicon nitride oxide film is formed on the EL layer so as to prevent corrosion by alkali elements contained in the packing agent 2083.

The opposing plate 2080 can use a glass plate, an aluminum plate, a stainless steel plate, a FRP (Fiberglass-Reinforced Plastics) plate, a PVF (polyvinyl fluoride) film, a Mylar film (trade name of Du Pont Co.), a polyester film, an acrylic film or an acrylic plate. Hygroscopicity can be improved by using a sheet having a sandwich structure in which an aluminum foil having a thickness of dozens of microns is sandwiched between the PVF film and the Mylar film. In this way, the EL element is kept under the sealed state and is cut off from the atmospheric air.

In FIG. 20(B), TFTs for the driving circuits (a CMOS circuit comprising the combination of n-channel TFTs and p-channel TFTs is hereby shown) 2022 and TFTs 2023 for the pixel unit (only the TFT for controlling the current to the EL element is hereby shown) are formed over the substrate 2010 and the underlying film 2021. Among these TFTs, the n-channel TFTs are equipped with the LDD region having the structure of this example in order to prevent the drop of the ON current resulting from the hot carrier effect and the drop of characteristics resulting from the Vth shift and the bias stress.

For example, the p-channel TFT and the n-channel TFT of the CMOS circuit shown in FIG. 5(B) can be used for the TFT 2022 for the driving circuit. For the TFTs 2023 for the pixel unit, a pixel TFT 204 as shown FIG. 5(B) or a p-channel TFT having similar constitution to the pixel TFT 204 can be used.

To fabricate the active matrix substrate for producing the EL display device, however, a self light emitting layer 2029 is formed using an EL material on the pixel electrode 2027. The self light emitting layer 2029 can be formed by freely combining known EL materials (positive hole injection layer, positive hole transportation layer, light emitting layer, electron transportation layer or electron injection layer) into a laminate structure or a single-layered structure. Any structure can be employed in accordance with known technologies. The EL materials include low molecular weight type materials and polymer type materials. When the low molecular weight type materials are used, vacuum deposition is employed. When the polymer materials are used, a simple method such as spin coating, printing or ink jetting can be employed.

The self light emitting layer 2029 is formed by a vacuum deposition method, an ink jetting method or a dispenser method using a shadow mask. In any case, color display becomes feasible when a light emitting layer capable of emitting light of a different wavelength for each pixel (red emitting layer, green emitting layer and blue emitting layer). It is further possible to employ a system that combines a color conversion layer (CCM) with color filters or a system that combines a white emitting layer with color filters. Needless to say, an EL device of monochroic emission can be produced, too.

After the self light emitting layer 2029 is formed, a cathode 2030 is formed on the self emitting layer 2029. The moisture and oxygen existing on the interface between the cathode 2030 and the self light emitting layer 2029 are preferably removed as much as possible. Therefore, it is necessary to continuously form the self light emitting layer 2029 and the cathode 2030 in vacuum, or to form the self light emitting layer 2029 in an inert atmosphere and then to form the cathode 2030 in vacuum without releasing the self light emitting layer 2029 to the atmospheric air. This example can conduct the film formation by using a film formation apparatus of a multi-chamber system (cluster tool system).

This example uses a laminate film of a LiF (lithium fluoride) film and an Al (aluminum) film as the cathode 2030. More concretely, a 1 nm-thick LiF (lithium fluoride) film is deposited on the self-light emitting layer 2029 by vacuum deposition, and a 300 nm-thick aluminum film is formed on the LiF film. Needless to say, a MgAg electrode as a known cathode material can be used, too. The cathode 2030 is connected to a wiring 2016 in a region represented by reference numeral 2031. The wiring 2016 is a power source line for supplying a predetermined voltage to the cathode 2030 and is connected to the FPC 2017 through an anisotropic conductive paste material 2032. A resin layer 2080 is further formed over the FPC 2017 to improve the bonding strength at this portion.

Contact holes must be bored in the inter-layer insulating film 2026 and the insulating film 2028 to electrically connect the cathode 2030 and the wiring 2016 in the region 2031. The contact holes may be bored at the time of etching of the inter-layer insulating film 2026 (at the time of formation of the contact holes for the pixel electrodes) or at the time of etching of the insulating film 2028 (at the time of formation of openings before the formation of the EL layer). When the insulating film 2028 is etched, the inter-layer insulating 2026 may be etched collectively. In this case, if the inter-layer insulating film 2026 and the insulating film 2028 are made of the same resin material, the shape of the contact holes becomes excellent.

The wiring 2016 is electrically connected to the FPC 2017 past through the space (which is sealed by the sealing agent 2081) between the seal 2019 and the substrate 2010. Other wirings 2014 and 2015 are electrically connected to the FPC 2017 past through and below the sealing material 2018 in the same way as the wiring 2016.

Figure 22A:
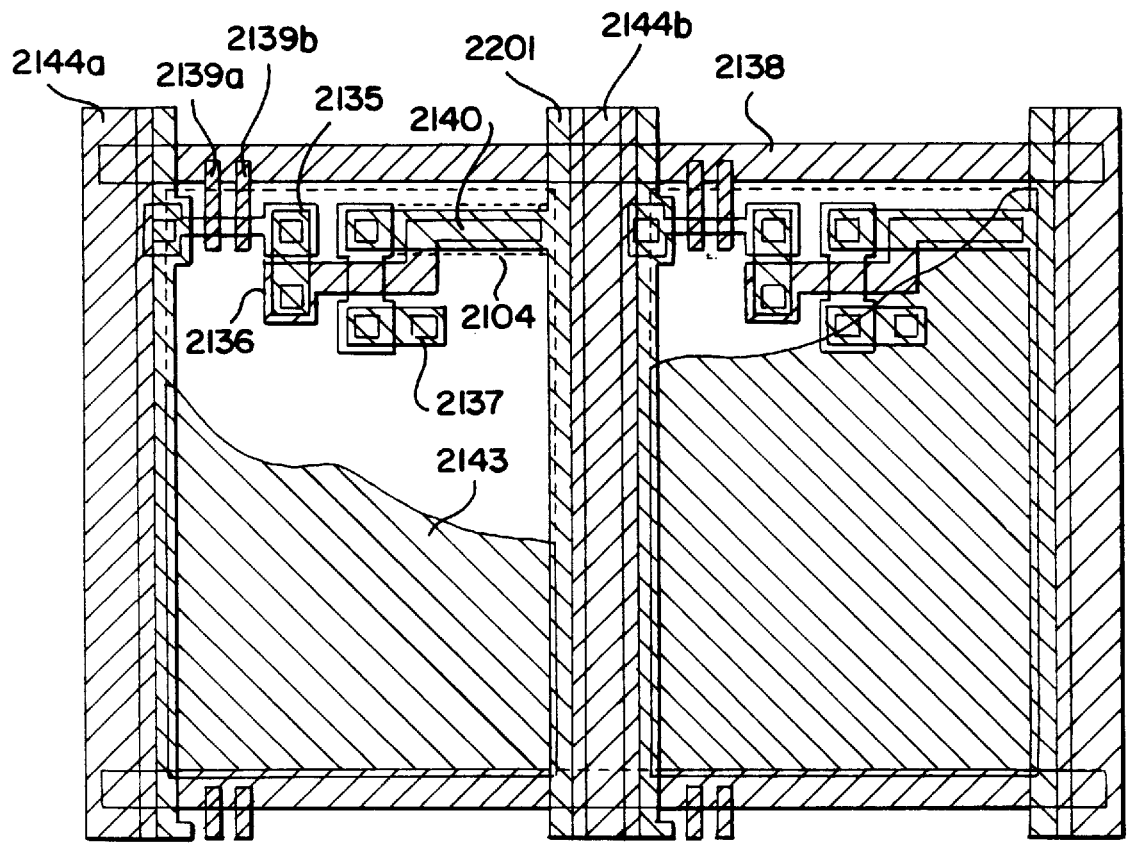
FIG. 22 is a top view and a circuit diagram of the pixel portion of the EL display device.
Figure 22B:
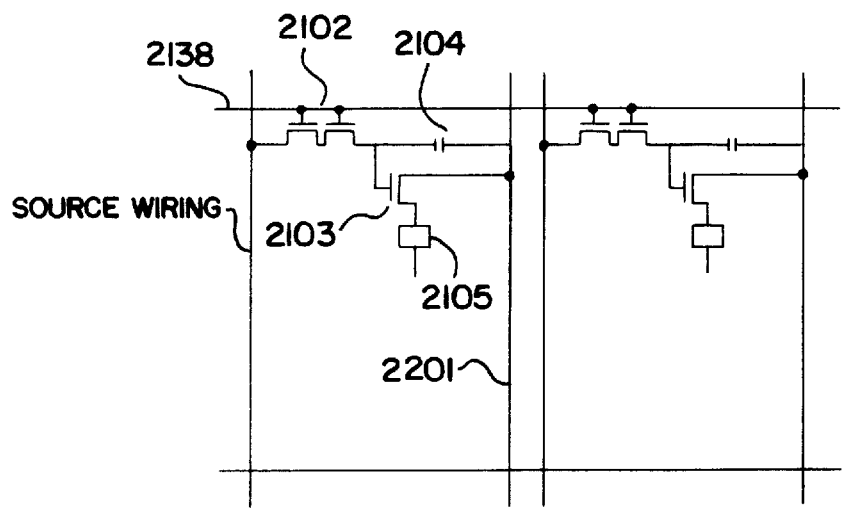

FIG. 21 shows a more detailed sectional structure of the pixel unit. FIG. 22(A) shows its more detailed top structure and FIG. 22(B) shows its circuit diagram. In FIG. 21(A), the switching TFT 2102 formed on the substrate 2101 is formed into the same structure as the n-channel TFT of the pixel matrix circuit shown in FIG. 5(B). Because the double-gate structure is employed, the structure becomes the one in which two TFTs are substantially connected in series, and the OFF current value can be reduced advantageously. Incidentally, though this example uses the double gate structure, a triple-gate structure or a multi-gate structure having a greater number of gates may be employed, as well.

The current controlling TFT 2103 is formed using the n-channel TFT of the CMOS circuit shown in FIG. 5(B). At this time, the drain line 2135 of the switching TFT 2102 is electrically connected to the gate electrode 2137 of the current controlling TFT by a wiring 2136. The wiring 2138 represented by reference numeral 2138 is a gate line that electrically connects the gate electrodes 2139a and 2139b of the switching TFT 2102.

When the current controlling TFT 2103 and the switching TFT 2102 are hydrogenated in accordance with the method of the present invention, the main characteristics of the TFT such as field mobility, the sub-threshold constant (S value), the ON current, etc, can be improved, and variance of the individual TFTs can be reduced. Therefore, this hydrogenation process is extremely effective for producing the EL display element. Because various characteristics can be improved as described above, gradation display becomes easier, and because variance of the characteristics of the TFTs can be reduced, non-uniformity of image display can be eliminated and display quality can be improved. Though the current controlling TFT 2103 is shown as having the single gate structure in this example, it may have a multi-gate structure formed by connecting a plurality of TFTs in series. It is further possible to employ the construction in which a plurality of TFTs are connected in parallel to substantially divide the channel formation region into a plurality of regions so that heat radiation can be effected highly efficiently. Such a construction is effective as a counter-measure for degradation.

As shown in FIG. 22(A), the wiring 2104 to serve as the gate electrode 2137 of the current controlling TFT 2103 overlaps with the drain line 2140 of the current controlling TFT 2103 through the insulating film in the region represented by reference numeral 2104. At this time, a capacitor is formed in this region 2104. The capacitor 2104 functions as a capacitor for holding a voltage applied to the gate of the current controlling TFT 2103. Incidentally, the drain line 2140 is connected to the current supply line (power source line) 2201, and a constant voltage is always applied thereto.

A first passivation film 2141 is disposed on the switching TFT 2102 and the current controlling TFT 2103, and a planarization film 2142 comprising a resin insulating film is formed on the first passivation film 2141. It is extremely important to planarize the level difference due to the TFTs by the use of the planarization film 2142. Because the self-light emitting layer to be later formed is extremely thin, the existence of any level difference might invite light emission defect. Therefore, planarization is preferably carried out before the pixel electrodes are formed so that the EL layer can be formed on a plane that is as planar as possible.

Reference numeral 2143 denotes a pixel electrode (cathode of the EL element) comprising a conductive film having high reflectivity. This pixel electrode 2143 is connected electrically to the drain of the current controlling TFT 2103. The pixel electrode 2143 preferably uses a conductive film having a low resistance such as an aluminum alloy film, a copper alloy film or a silver alloy film, or their laminate film. A laminate structure with other conductive films may naturally be used. A light emitting layer 2144 is formed inside a groove (corresponding to the pixel) defined by banks 2144a and 2144b made of an insulating film (preferably a resin). Though the drawing shows only one pixel, light emitting layers corresponding to R (red), G (green) and B (blue) may be formed dividedly. A π conjugate polymer material is used for the organic EL material to form the light emitting layer. Typical examples of the polymer materials are poly-paraphenylene vinylene (PPV), polyvinyl carbazole (PVK) and polyfluorene. Incidentally, various PPV type organic EL materials are known. It is possible to select the materials described, for example, in H Shenk, H. Becker, O. Gelsen, E. Kluge, W. Kreuder and H. Spreitzer, "Polymers for Light Emitting Diodes", Euro Display, Proceedings, 1999, p. 33–37, and in Japanese Patent Laid-Open No. 92576/1998.

Concrete examples of the light emitting layers include cyano-polyphenylene vinylene as the red emitting layer, polyphenylene vinylene for the green emitting layer and polyphenylene vinylene or polyalkylphenylene for the blue emitting layer. The film thickness may be from 30 to 150 nm (preferably from 40 to 100 nm). However, these examples are merely an example of the organic EL materials that can be used as the light emitting layers, and they are not at all restrictive in any way. The EL layer (the layers for emitting light and for moving the carriers for light emission) may be formed by freely combining the light emitting layer, the charge transportation layer or the charge injection layer. For instance, though this example illustrates the example using the polymer materials for the light emitting layer, low molecular weight organic EL materials may be used, as well. Inorganic materials such as silicon carbide can be used for the charge transfer layer and the charge injection layer. Known materials can be used for these organic EL materials and the inorganic materials.

This example uses the EL layer having the laminate structure in which the positive hole injection layer 2146 made of PEDOT (polythiophene) or PAni (polyaniline) is disposed on the light emitting layer 2145. An anode comprising a transparent conductive film is placed on the positive hole injection layer 2146. In this example, the rays of light generated by the light emitting layer 2145 are emitted towards the upper surface side (above the TFT). Therefore, the anode must be light transmissible. A compound between indium oxide and tin oxide or a compound between indium oxide and zinc oxide can be used for the transparent conductive film. However, the transparent conductive film is preferably the one that can be film-formed at a temperature as low as possible because it is formed after the light emitting layer having low heat resistance and the positive hole injection layer are formed.

At the point when the anode 2147 is formed, the EL element 2105 is completed. Incidentally, the term "EL element" hereby means the capacitor comprising the pixel electrode (cathode) 2143, the light emitting layer 2145, the positive hole injection layer 2146 and the anode 2147. As shown in FIG. 22(A), the pixel electrode 2143 corresponds substantially to the area of the pixel, and the pixel functions as a whole as the EL element. Therefore, utilization efficiency of light emission is extremely high and bright image display becomes possible.

Incidentally, the second passivation film 2148 is further disposed on the anode 2147 in this embodiment. A silicon nitride film or a silicon nitride oxide film is preferred as the second passivation film. The object of this film is to cut off the EL element from outside, and has technical significance of both preventing degradation due to oxidation of the organic EL material and restricting degassing from the organic EL material. In this way, reliability of the EL display device can be improved.

As described above, the EL display panel according to the present invention includes the pixel unit comprising the pixels each having the structure shown in FIG. 22, the switching TFT and the current controlling TFT. These TFTs that are fabricated by the hydrogenation method of the present invention exhibit extremely stable characteristics, and make it possible to effect excellent image display in the EL display device.

FIG. 21(B) shows an example where the radiating direction of the rays of light from the self light emitting layer is opposite to that direction shown in FIG. 21(A). The current controlling TFT 2601 is formed from the p-channel TFT of the CMOS circuit shown in FIG. 5(B). The fabrication process is illustrated in Example 2. This example uses a transparent conductive film as the pixel electrode (anode) 2150. More concretely, it uses a conductor film made of a compound between indium oxide and zinc oxide. Naturally, a conductor film made of a compound between indium oxide and tin oxide can be used, too.

After the banks 2151a and 2151b comprising the insulating film are formed, the light emitting layer 2152 made of polyvinylcarbazole is formed by solution coating. An electron injection layer 2153 made of potassium acetyl acetonate (abbreviated as "acacK") and the cathode 2154 made of an aluminum alloy are formed on the light emitting layer 2152. In this case, the cathode 2154 functions also as the passivation film. In this way, the EL element 2602 is formed. In this example, the rays of light generated by the light emitting layer 2153 are radiated towards the substrate on which the TFTs are formed, as indicated by an arrow. When the structure of this example is employed, the current controlling TFT 2601 preferably comprises the p-channel TFT. Such an EL display element can be applied to the semiconductor device shown in FIG. 7 or 8.

Example 10

In this example, FIG. 23 shows an example where a pixel has a different structure from the structure of the pixel of the circuit diagram shown in FIG. 22(B). Reference numeral 2701 denotes a source wiring of a switching TFF 2702 and reference numeral 2703 denotes a gate wiring of a switching TFT 2702. Reference numeral 2704 denotes a current controlling TFT and reference numeral 2705 denotes a capacitor. Reference numerals 2706 and 2708 denote current supply lines and reference numeral 2707 denotes an EL element.

Figure 23A:
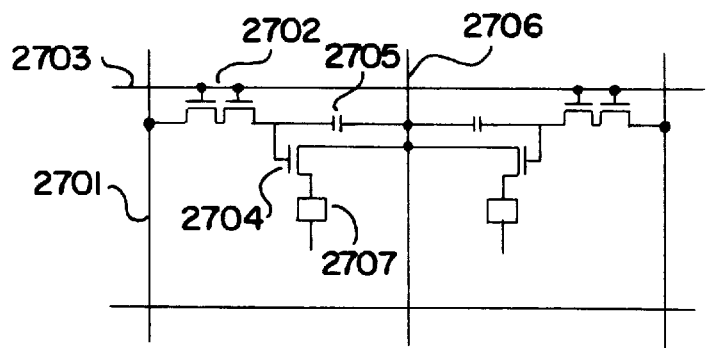
FIG. 23 is a circuit diagram of an example of the pixel portion of the EL display device.

FIG. 23(A) shows an example where the current supply line 2706 is used in common between two pixels. In other words, this example is characterized in that two pixels are arranged in line symmetry with the current supply line 2706 as the center. In this case, since the number of power supply lines can be reduced, and the pixel unit can be further miniaturized.

Figure 23B:
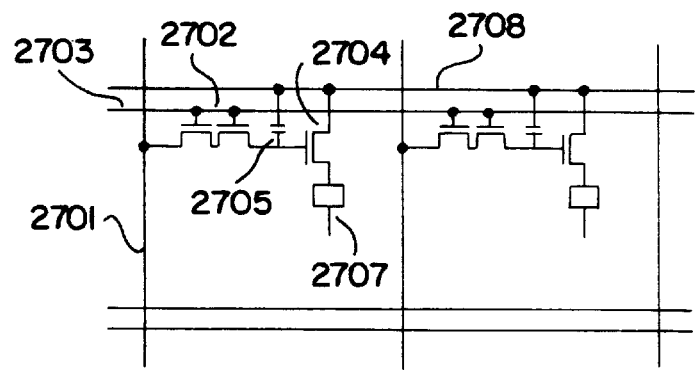

FIG. 23(B) shows an example where the current supply line 2708 is disposed in parallel with the gate wiring 2703. Incidentally, in the structure shown in FIG. 23(B), the current supply line 2708 and the gate wiring 2703 do not overlap with each other. They can be formed in such a manner as to overlap with each other through an insulating film provided that they are formed in different layers. In this case, since the power supply line 2708 and the gate wiring 2703 can share the occupying area, the pixel unit can be further miniaturized.

Figure 23C:
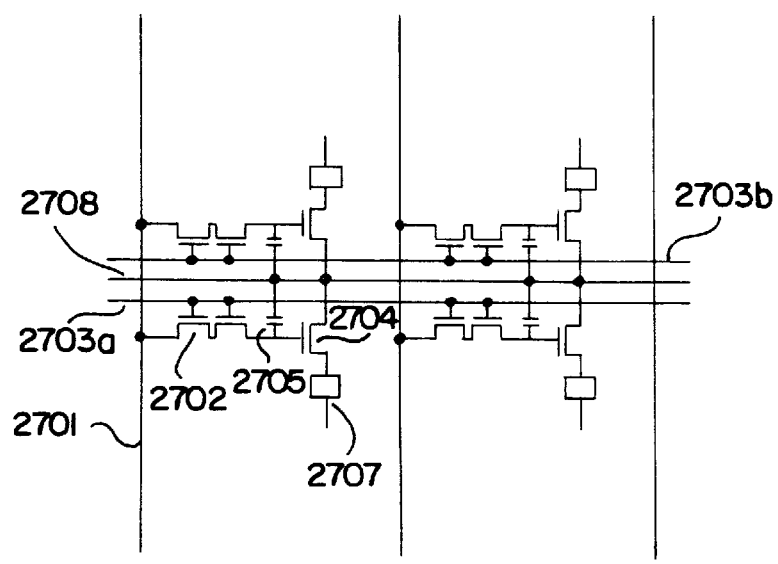

The structure shown in FIG. 23(C) is characterized in that the current supply line 2708 is disposed in parallel with the gate wiring 2703 in the same way as in the structure shown in FIG. 23(B). Two pixels are formed in line symmetry with the current supply line 2708 as the center. It is also effective to dispose the current supply line 2708 in such a manner as to overlap with either one of the gate wirings 2703. In this case, since the number of the power supply lines can be reduced, the pixel unit can be further miniaturized. FIG. 23(B) shows the structure in which the capacitor 2705 is disposed for holding the voltage applied to the current controlling TFT 2704, but this capacitor 2705 can be omitted.

Because the n-channel TFT of the present invention shown in FIG. 21(A) is used for the current controlling TFT 2704, the TFT includes the LDD region so formed as to overlap with the gate electrode through the gate insulating film. A parasitic capacitance generally referred to as the "gate capacitance" is formed in this overlapping region, and this example is characterized in that this parasitic capacitance is positively utilized in place of the capacitor 2705. The capacitance of this parasitic capacitance changes with the overlapping area between the gate electrode and the LDD region, and is determined by the length of the LDD region contained in the overlapping region. The capacitor 2705 can be omitted similarly in the structures shown in FIGS. 23(A), (B) and (C).

Effects of the Invention

The present invention can avoid the damage and the influences of contamination to the semiconductor layer by conducting hydrogenation from the surface of the first insulating film. Since hydrogen supplied into the first insulating film diffuses into the lower layer side of the first insulating film, defects of the semiconductor layer can be neutralized by hydrogen. On the semiconductor layer that is formed into the predetermined shape, the process step of forming the hydrogen-containing first insulating film and the process step of forming the second insulating film in close contact with the first insulating film and conducting heat-treatment in a hydrogen atmosphere or in an atmosphere containing hydrogen formed by plasma generation are carried out. In consequence, hydrogen supplied from the surface of the second insulating film diffuses into the first insulating film, and hydrogen that becomes excessive in the first insulating film diffuses into the lower layer side beneath this insulating film and can hydrogenate the semiconductor layer.

The present invention executes the process steps of forming a hydrogen-containing first insulating film on the semiconductor layer that is formed into the predetermined shape, conducting heat-treatment in a hydrogen-containing atmosphere or in an atmosphere containing hydrogen formed by plasma generation, and forming a hydrogen-containing third insulating film on the first insulating film and then conducting heat-treatment in a hydrogen- or nitrogen-containing atmosphere. In this way, the present invention can obtain the similar effects. Another method of the present invention comprises the process steps of forming a hydrogen-containing first insulating film on the semiconductor layer that is formed into a predetermined shape, conducting heat-treatment in a hydrogen-containing atmosphere or in an atmosphere containing hydrogen formed by plasma generation, forming a hydrogen-containing third insulating film on the first insulating film, and conducting heat treatment in an atmosphere containing hydrogen or nitrogen. In this way, the present invention can obtain the similar effects. Preferably, the method of the present invention comprises the process steps of forming a hydrogen-containing first insulating film on the semiconductor layer that is formed into a predetermined shape, conducting heat-treatment in a hydrogen-containing atmosphere or in an atmosphere containing hydrogen formed by plasma generation, forming a second insulating film in close contact with the first insulating film, conducting heat-treatment in a hydrogen atmosphere or in an atmosphere containing hydrogen formed by plasma generation, forming a hydrogen-containing third insulating film on the second insulating film, and then conducting heat-treatment in an atmosphere containing hydrogen or nitrogen. In this way, similar effects can be obtained.

The TFTs using the semiconductor layer for which hydrogenation is executed by the method of the present invention exhibit extremely excellent characteristics, and such TFTs can be applied broadly to various semiconductor devices.

What is claimed is:

1. A method of fabricating a semiconductor device comprising the steps of:

forming a semiconductor layer over a substrate;

forming a gate insulating film over said semiconductor layer;

forming a gate electrode over said gate insulating film;

forming an insulating film containing hydrogen over said gate electrode and said gate insulating film; and heating said insulating film containing hydrogen in a hydrogen atmosphere thereby diffusing hydrogen contained in said insulating film into said semiconductor layer.

2. A method of fabricating a semiconductor device comprising the steps of:

forming a semiconductor layer over a substrate;

forming a gate insulating film over said semiconductor layer;

forming a gate electrode over said gate insulating film;

forming a first insulating film containing hydrogen over said gate electrode and said gate insulating film; and forming a second insulating film on said first insulating film; and performing a heat-treatment in a hydrogen atmosphere thereby diffusing hydrogen contained in said first insulating film into said semiconductor layer.

3. A method of fabricating a semiconductor device comprising the steps of:

forming a semiconductor layer over a substrate;

forming a gate insulating film over said semiconductor layer;

forming a gate electrode over said gate insulating film;

forming a first insulating film containing hydrogen over said gate electrode and said gate insulating film;

performing a first heat-treatment in a hydrogen atmosphere thereby diffusing hydrogen contained in said first insulating film into said semiconductor layer;

forming a second insulating film on said first insulating film; and performing a second heat-treatment in a hydrogen atmosphere after forming said second insulating film.

4. A method of fabricating a semiconductor device comprising the steps of:

forming a semiconductor layer over a substrate;

forming a gate insulating film over said semiconductor layer;

forming a gate electrode over said gate insulating film;

forming a first insulating film over said gate electrode and said gate insulating film;

performing a heat-treatment in a hydrogen atmosphere after forming said first insulating film thereby diffusing hydrogen contained in said first insulating film into said semiconductor layer;

forming a second insulating film containing hydrogen on said first insulating film; and performing a heat-treatment in an atmosphere containing hydrogen or nitrogen after forming said second insulating film.

5. A method of fabricating a semiconductor device comprising the steps of:

forming a semiconductor layer over a substrate;

forming a gate insulating film over said semiconductor layer;

forming a gate electrode over said gate insulating film;

forming a first insulating film containing hydrogen over said gate electrode and said gate insulating film;

forming a second insulating film on said first insulating film;

performing a heat-treatment in a hydrogen atmosphere after forming said second insulating film thereby diffusing hydrogen contained in said first insulating film into said semiconductor layer;

forming a third insulating film containing hydrogen on said second insulating film; and performing a heat-treatment in an atmosphere containing hydrogen or nitrogen after forming said third insulating film.

6. A method of fabricating a semiconductor device comprising the steps of:

forming a semiconductor layer over a substrate;

forming a gate insulating film over said semiconductor layer;

forming a gate electrode over said gate insulating film;

forming a first insulating film over said gate electrode and said gate insulating film;

performing a first heat-treatment in a hydrogen atmosphere after forming said first insulating film thereby diffusing hydrogen contained in said first insulating film into said semiconductor layer;

forming a second insulating film on said first insulating film;

performing a second heat-treatment in a hydrogen atmosphere after forming said second insulating film;

forming a third insulating film containing hydrogen on said second insulating film; and performing a third heat-treatment in an atmosphere containing hydrogen or nitrogen after forming said third insulating film.

7. A method of fabricating a semiconductor device according to claim 2, wherein said first insulating film comprises a silicon nitride oxide film.

8. A method of fabricating a semiconductor device according to claim 2, wherein said second insulating film comprises a silicon nitride oxide film.

9. A method of fabricating a semiconductor device according to claim 4, wherein said third insulating film comprises a silicon nitride oxide film or a silicon nitride film.

10. A method of fabricating a semiconductor device according to claim 7, wherein a carbon concentration in each of said first and second insulating films is not greater than $2 \times 10^{19} cm^{-3}$.

11. A method of fabricating a semiconductor device comprising the steps of:

forming a semiconductor layer formed over a substrate;

forming a gate insulating film formed over said semiconductor layer;

forming a gate electrode over said gate insulating film;

forming a silicon nitride oxide film from silane, nitrous oxide and ammonia over said gate electrode and said gate insulating film; and performing a heat-treatment in a hydrogen atmosphere after forming said silicon nitride oxide film thereby diffusing hydrogen contained in said silicon nitride oxide film into said semiconductor layer.

12. A method of fabricating a semiconductor device comprising the steps of:

forming a semiconductor layer over a substrate;

forming a gate insulating film over said semiconductor layer;

forming a gate electrode over said gate insulating film;

forming a first silicon nitride oxide film from silane, nitrous oxide and ammonia said gate electrode and said gate insulating film;

forming a second silicon nitride oxide film from silane and nitrous oxide on said first silicon nitride oxide film; and performing a heat-treatment in a hydrogen atmosphere after forming said second silicon nitride oxide film thereby diffusing hydrogen contained in said first silicon nitride oxide film into said semiconductor layer.

13. A method of fabricating a semiconductor device comprising the steps of:

forming a semiconductor layer over a substrate;

forming a gate insulating film over said semiconductor layer;

forming a gate electrode over said gate insulating film;

forming a first silicon nitride oxide film from silane, nitrous oxide and ammonia over said gate electrode and said gate insulating film;

performing a first heat-treatment in a hydrogen atmosphere after forming said first silicon nitride oxide film thereby diffusing hydrogen contained in said first silicon nitride oxide film into said semiconductor layer;

forming a second silicon nitride oxide film from silane and nitrous oxide on said first silicon nitride oxide film; and performing a second heat-treatment in a hydrogen atmosphere after forming said second silicon nitride oxide film.

14. A method of fabricating a semiconductor device comprising the steps of:

forming a semiconductor layer over a substrate;

forming a gate insulating film over said semiconductor layer;

forming a gate electrode over said gate insulating film;

forming a first silicon nitride oxide film from silane, nitrous oxide and ammonia over said gate electrode and said gate insulating film;

performing a first heat-treatment in a hydrogen atmosphere after forming said first silicon nitride oxide film thereby diffusing hydrogen contained in said first silicon nitride oxide film into said semiconductor layer;

forming a hydrogen-containing insulating film on said first silicon nitride oxide film; and performing a second heat-treatment in an atmosphere containing hydrogen or nitrogen after said forming said hydrogen-containing insulating film.

15. A method of fabricating a semiconductor device comprising the steps of:

forming a semiconductor layer over a substrate;

forming a gate insulating film over said semiconductor layer;

forming a gate electrode over said gate insulating film;

forming a first silicon nitride oxide film from silane, nitrous oxide and ammonia over said gate electrode and said gate insulating film;

forming a second silicon nitride oxide film from silane and nitrous oxide on said first silicon nitride oxide film;

performing a first heat-treatment in a hydrogen atmosphere after forming said second silicon nitride oxide film thereby diffusing hydrogen contained in said first silicon nitride oxide film into said semiconductor layer;

forming a hydrogen-containing insulating film on said second silicon nitride oxide film; and performing a second heat-treatment in an atmosphere containing hydrogen or nitrogen after forming said hydrogen-containing insulating film.

16. A method of fabricating a semiconductor device comprising the steps of:

forming a semiconductor layer over a substrate;

forming a gate insulating film over said semiconductor layer;

forming a gate electrode over said gate insulating film;

forming a first silicon nitride oxide film from silane, nitrous oxide and ammonia over said gate electrode and said gate insulating film;

performing a first heat-treatment in a hydrogen atmosphere after forming said first silicon nitride oxide film thereby diffusing hydrogen contained in said first silicon nitride oxide film into said semiconductor layer;

forming a second silicon nitride oxide film from silane and nitrous oxide on said first silicon nitride oxide film;

performing a second heat-treatment in a hydrogen atmosphere after forming said second insulating film;

forming a hydrogen-containing insulating film on said second silicon nitride oxide film; and performing a third heat-treatment in an atmosphere containing hydrogen or nitrogen after forming said hydrogen-containing insulating film.

17. A method of fabricating a semiconductor device according to claim 14, wherein said hydrogen-containing insulating film is a silicon nitride oxide film formed from silane, nitrous oxide and ammonia or a silicon nitride film formed from silane, ammonia and nitrogen.

18. A method of fabricating a semiconductor device according to claim 11, wherein a carbon concentration in said first silicon nitride oxide film is not greater than $2 \times 10^{19} cm^{-3}$.

19. A method of fabricating a semiconductor device according to claim 12, wherein a carbon concentration in said second silicon nitride oxide film is not greater than $2 \times 10^{19} cm^{-3}$.

20. A method of fabricating a semiconductor device according to claim 15, wherein a carbon concentration in said second silicon nitride oxide film is not greater than $2 \times 10^{19} cm^{-3}$.

21. A method of fabricating a semiconductor device according to claim 17, wherein a carbon concentration in said hydrogen-containing insulating film is not greater than $2 \times 10^{19} cm^{-3}$.

22. A method of fabricating a semiconductor device according to claim 1, wherein said semiconductor device is a liquid crystal display device, an EL display device or an image sensor.

23. A method of fabricating a semiconductor device according to claim 1, wherein said semiconductor device is incorporated into a cellular telephone, a video camera, a mobile computer, a head mount display, a projector, a portable book, a digital camera, a car navigation system or a personal computer.

24. A method of fabricating a semiconductor device according to claim 3, wherein said first insulating film comprises a silicon nitride oxide film.

25. A method of fabricating a semiconductor device according to claim 4, wherein said first insulating film comprises a silicon nitride oxide film.

26. A method of fabricating a semiconductor device according to claim 5, wherein said first insulating film comprises a silicon nitride oxide film.

27. A method of fabricating a semiconductor device according to claim 6, wherein said first insulating film comprises a silicon nitride oxide film.

28. A method of fabricating a semiconductor device according to claim 3, wherein said second insulating film comprises a silicon nitride oxide film.

29. A method of fabricating a semiconductor device according to claim 5, wherein said second insulating film comprises a silicon nitride oxide film.

30. A method of fabricating a semiconductor device according to claim 6, wherein said second insulating film comprises a silicon nitride oxide film.

31. A method of fabricating a semiconductor device according to claim 5, wherein said third insulating film comprises a silicon nitride oxide film or a silicon nitride film.

32. A method of fabricating a semiconductor device according to claim 6, wherein said third insulating film comprises a silicon nitride oxide film or a silicon nitride film.

33. A method of fabricating a semiconductor device according to claim 24, wherein a carbon concentration in each of said first and second insulating films is not greater than $2 \times 10^{19} cm^{-3}$.

34. A method of fabricating a semiconductor device according to claim 25, wherein a carbon concentration in each of said first and second insulating films is not greater than $2 \times 10^{19} cm^{-3}$.

35. A method of fabricating a semiconductor device according to claim 26, wherein a carbon concentration in each of said first, second and third insulating films is not greater than $2 \times 10^{19} cm^{-3}$.

36. A method of fabricating a semiconductor device according to claim 27, wherein a carbon concentration in each of said first, second and third insulating films is not greater than $2 \times 10^{19} cm^{-3}$.

37. A method of fabricating a semiconductor device according to claim 15, wherein said hydrogen-containing insulating film is a silicon nitride oxide film formed from silane, nitrous oxide and ammonia or a silicon nitride film formed from silane, ammonia and nitrogen.

38. A method of fabricating a semiconductor device according to claim 16, wherein said hydrogen-containing insulating film is a silicon nitride oxide film formed from silane, nitrous oxide and ammonia or a silicon nitride film formed from silane, ammonia and nitrogen.

39. A method of fabricating a semiconductor device according to claim 12, wherein a carbon concentration in said first silicon nitride oxide film is not greater than $2 \times 10^{19} cm^{-3}$.

40. A method of fabricating a semiconductor device according to claim 13, wherein a carbon concentration in said first silicon nitride oxide film is not greater than $2 \times 10^{19} cm^{-3}$.

41. A method of fabricating a semiconductor device according to claim 14, wherein a carbon concentration in said first silicon nitride oxide film is not greater than $2 \times 10^{19} cm^{-3}$.

42. A method of fabricating a semiconductor device according to claim 15, wherein a carbon concentration in said first silicon nitride oxide film is not greater than $2 \times 10^{19} cm^{-3}$.

43. A method of fabricating a semiconductor device according to claim 16, wherein a carbon concentration in said first silicon nitride oxide film is not greater than $2 \times 10^{19} cm^{-3}$.

44. A method of fabricating a semiconductor device according to claim 13, wherein a carbon concentration in said second silicon nitride oxide film is not greater than $2\times10^{19} cm^{-3}$.

45. A method of fabricating a semiconductor device according to claim 16, wherein a carbon concentration in said second silicon nitride oxide film is not greater than $2\times10^{19} cm^{-3}$.

46. A method of fabricating a semiconductor device according to claim 37, wherein a carbon concentration in said hydrogen-containing insulating film is not greater than $2\times10^{19} cm^{-3}$.

47. A method of fabricating a semiconductor device according to claim 48, wherein a carbon concentration in said hydrogen-containing insulating film is not greater than $2\times10^{19} cm^{-3}$.

48. A method of fabricating a semiconductor device according to claim 2, wherein said semiconductor device is a liquid crystal display device, an EL display device or an image sensor.

49. A method of fabricating a semiconductor device according to claim 3, wherein said semiconductor device is a liquid crystal display device, an EL display device or an image sensor.

50. A method of fabricating a semiconductor device according to claim 4, wherein said semiconductor device is a liquid crystal display device, an EL display device or an image sensor.

51. A method of fabricating a semiconductor device according to claim 5, wherein said semiconductor device is a liquid crystal display device, an EL display device or an image sensor.

52. A method of fabricating a semiconductor device according to claim 6, wherein said semiconductor device is a liquid crystal display device, an EL display device or an image sensor.

53. A method of fabricating a semiconductor device according to claim 11, wherein said semiconductor device is a liquid crystal display device, an EL display device or an image sensor.

54. A method of fabricating a semiconductor device according to claim 12, wherein said semiconductor device is a liquid crystal display device, an EL display device or an image sensor.

55. A method of fabricating a semiconductor device according to claim 13, wherein said semiconductor device is a liquid crystal display device, an EL display device or an image sensor.

56. A method of fabricating a semiconductor device according to claim 14, wherein said semiconductor device is a liquid crystal display device, an EL display device or an image sensor.

57. A method of fabricating a semiconductor device according to claim 15, wherein said semiconductor device is a liquid crystal display device, an EL display device or an image sensor.

58. A method of fabricating a semiconductor device according to claim 16, wherein said semiconductor device is a liquid crystal display device, an EL display device or an image sensor.

59. A method of fabricating a semiconductor device according to claim 2, wherein said semiconductor device is incorporated into a cellular telephone, a video camera, a mobile computer, a head mount display, a projector, a portable book, a digital camera, a car navigation system or a personal computer.

60. A method of fabricating a semiconductor device according to claim 3, wherein said semiconductor device is incorporated into a cellular telephone, a video camera, a mobile computer, a head mount display, a projector, a portable book, a digital camera, a car navigation system or a personal computer.

61. A method of fabricating a semiconductor device according to claim 4, wherein said semiconductor device is incorporated into a cellular telephone, a video camera, a mobile computer, a head mount display, a projector, a portable book, a digital camera, a car navigation system or a personal computer.

62. A method of fabricating a semiconductor device according to claim 5, wherein said semiconductor device is incorporated into a cellular telephone, a video camera, a mobile computer, a head mount display, a projector, a portable book, a digital camera, a car navigation system or a personal computer.

63. A method of fabricating a semiconductor device according to claim 6, wherein said semiconductor device is incorporated into a cellular telephone, a video camera, a mobile computer, a head mount display, a projector, a portable book, a digital camera, a car navigation system or a personal computer.

64. A method of fabricating a semiconductor device according to claim 11, wherein said semiconductor device is incorporated into a cellular telephone, a video camera, a mobile computer, a head mount display, a projector, a portable book, a digital camera, a car navigation system or a personal computer.

65. A method of fabricating a semiconductor device according to claim 12, wherein said semiconductor device is incorporated into a cellular telephone, a video camera, a mobile computer, a head mount display, a projector, a portable book, a digital camera, a car navigation system or a personal computer.

66. A method of fabricating a semiconductor device according to claim 13, wherein said semiconductor device is incorporated into a cellular telephone, a video camera, a mobile computer, a head mount display, a projector, a portable book, a digital camera, a car navigation system or a personal computer.

67. A method of fabricating a semiconductor device according to claim 14, wherein said semiconductor device is incorporated into a cellular telephone, a video camera, a mobile computer, a head mount display, a projector, a portable book, a digital camera, a car navigation system or a personal computer.

68. A method of fabricating a semiconductor device according to claim 15, wherein said semiconductor device is incorporated into a cellular telephone, a video camera, a mobile computer, a head mount display, a projector, a portable book, a digital camera, a car navigation system or a personal computer.

69. A method of fabricating a semiconductor device according to claim 16, wherein said semiconductor device is incorporated into a cellular telephone, a video camera, a mobile computer, a head mount display, a projector, a portable book, a digital camera, a car navigation system or a personal computer.

* * * * *